(12) United States Patent
Shinotsuka et al.

(10) Patent No.: US 10,446,773 B2
(45) Date of Patent: Oct. 15, 2019

(54) SUBSTRATE, OPTICAL ELEMENT, MOLD, ORGANIC LIGHT-EMITTING ELEMENT, ORGANIC THIN-FILM SOLAR CELL, AND METHOD FOR PRODUCING SUBSTRATE

(71) Applicant: OJI HOLDINGS CORPORATION, Tokyo (JP)

(72) Inventors: Kei Shinotsuka, Tokyo (JP); Etsuko Kawamukai, Tokyo (JP)

(73) Assignee: Oji Holdings Corporation, Tokyo (JP)

( * ) Notice: Subject to any disclaimer, the term of this patent is extended or adjusted under 35 U.S.C. 154(b) by 0 days.

(21) Appl. No.: 15/778,203

(22) PCT Filed: Dec. 6, 2016

(86) PCT No.: PCT/JP2016/086271
§ 371 (c)(1),
(2) Date: May 22, 2018

(87) PCT Pub. No.: WO2017/099086
PCT Pub. Date: Jun. 15, 2017

(65) Prior Publication Data
US 2018/0351122 A1 Dec. 6, 2018

(30) Foreign Application Priority Data

Dec. 10, 2015 (JP) .................................. 2015-240768
Jul. 22, 2016 (JP) .................................. 2016-143877
Aug. 23, 2016 (JP) .................................. 2016-162633

(51) Int. Cl.
*H01L 51/44* (2006.01)
*H01L 31/0236* (2006.01)
(Continued)

(52) U.S. Cl.
CPC ........ *H01L 51/442* (2013.01); *H01L 31/0236* (2013.01); *H01L 33/005* (2013.01);
(Continued)

(58) Field of Classification Search
None
See application file for complete search history.

(56) References Cited

U.S. PATENT DOCUMENTS 8,659,221 B2 * 2/2014 Jones .................... B82Y 20/00
                                                313/498
2014/0001450 A1  1/2014 Shinotsuka et al.
(Continued)

FOREIGN PATENT DOCUMENTS

CN    104393134 A    3/2015
JP    2013-68872 A   4/2013
(Continued)

OTHER PUBLICATIONS

Patent Cooperation Treaty, International Search Report and Written Opinion of the International Searching Authority, International Patent Application No. PCT/JP2016/086271, dated Mar. 7, 2017, 10 Pages (Including English Translation).
(Continued)

*Primary Examiner* — Grant S Withers
(74) *Attorney, Agent, or Firm* — Fenwick & West LLP

(57) ABSTRACT

Provided is an optical element substrate with which it is possible to increase the efficiency of use of light energy. An uneven structure on one substrate surface for an optical element is provided with a plurality of projections. The contour shape of the projections has an arc shape in plan view facing the one surface. The contour shape is formed by a first arc section and second arc section having different center points. The first arc section and second arc section bulge in mutually opposite directions.

16 Claims, 20 Drawing Sheets

(51) Int. Cl.
*H01L 33/38* (2010.01)
*H01L 33/00* (2010.01)
*H01L 33/22* (2010.01)
*H01L 51/50* (2006.01)
*H05B 33/02* (2006.01)
*H05B 33/10* (2006.01)
*H01L 51/00* (2006.01)
*H01L 51/52* (2006.01)

(52) U.S. Cl.
CPC .............. *H01L 33/22* (2013.01); *H01L 33/38* (2013.01); *H01L 51/0034* (2013.01); *H01L 51/0096* (2013.01); *H01L 51/447* (2013.01); *H01L 51/50* (2013.01); *H01L 51/5275* (2013.01); *H05B 33/02* (2013.01); *H05B 33/10* (2013.01); *Y02E 10/549* (2013.01); *Y02P 70/521* (2015.11)

(56) References Cited

U.S. PATENT DOCUMENTS

| | | | |
|---|---|---|---|
| 2014/0167017 A1 | 6/2014 | Shinotsuka et al. | |
| 2016/0056352 A1 | 2/2016 | Koike et al. | |
| 2016/0093832 A1 | 3/2016 | Shinotsuka et al. | |
| 2016/0149149 A1* | 5/2016 | Shinotsuka | H01L 51/0017 136/255 |
| 2017/0005295 A1 | 1/2017 | Takeda et al. | |
| 2017/0301887 A1 | 10/2017 | Shinotsuka et al. | |

FOREIGN PATENT DOCUMENTS

| | | |
|---|---|---|
| JP | 2013-229581 A | 11/2013 |
| JP | 2014-130712 A | 7/2014 |
| JP | 2015-115508 A | 6/2015 |
| JP | 2015-153474 A | 8/2015 |
| WO | WO2012/002240 A1 | 1/2012 |
| WO | WO2012-060404 A1 | 5/2012 |
| WO | WO2013/005638 A1 | 1/2013 |
| WO | WO2014/057808 A1 | 4/2014 |
| WO | WO2014/208713 A1 | 12/2014 |
| WO | WO2015/166764 A1 | 11/2015 |
| WO | WO2016/189868 A1 | 12/2016 |

OTHER PUBLICATIONS

PCT International Preliminary Report on Patentability, PCT Application No. PCT/JP2016/086271, dated Jun. 14, 2018, 6 pages.

* cited by examiner

SUBSTRATE, OPTICAL ELEMENT, MOLD, ORGANIC LIGHT-EMITTING ELEMENT, ORGANIC THIN-FILM SOLAR CELL, AND METHOD FOR PRODUCING SUBSTRATE

CROSS REFERENCE TO RELATED APPLICATIONS

This application is a 35 U.S.C. 371 national stage filing of International Application No. PCT/JP2016/086271, filed on Dec. 6, 2016 which claims the benefit of Japanese Patent Application No. 2015-240768 filed on Dec. 10, 2015; Japanese Patent Application No. 2016-143877 filed on Jul. 22, 2016; and Japanese Patent Application No. 2016-162633 filed on Aug. 23, 2016, the disclosures of which are incorporated herein by reference.

TECHNICAL FIELD

The present invention relates to a substrate including a recessing and protruding structure on a surface of the substrate, an optical element, a mold, an organic light emitting element, an organic thin film solar cell, and a method for manufacturing the substrate.

BACKGROUND ART

An organic light emitting diode is a light emitting element utilizing organic electroluminescence (hereinafter, organic EL), and typically include an organic EL layer sandwiched between an anode conductive layer and a cathode conductive layer. The organic EL layer includes a light emitting layer containing an organic light emitting material. As necessary, the organic EL layer includes, for example, an electron injection layer, an electron transport layer, a hole injection layer, and a hole transport layer, in addition to a light emitting layer. Organic light emitting diodes can be categorized into two types, the bottom-emission type and the top-emission type, depending on the face through which light from the light emitting layer is extracted to the outside.

Organic light emitting diodes have advantages such as smaller viewing angle dependence, less power consumption, and ability to form a very thin product. However, one problem with organic light emitting diodes is their low luminescence intensity compared with, for example, nitride semiconductor light emitting elements, and thus there is a need for improvement in light extraction efficiency. The light extraction efficiency is a ratio of the amount of light energy released to the atmosphere from the light extraction face (e.g., substrate face for the bottom-emission type) to the amount of light energy emitted from the organic EL layers. Light from the organic EL layer radiates in all directions, and much of the light propagates in a guided mode, with the total reflection repeated between the interfaces of a plurality of layers having different refractive indices. As the light propagates between layers, they may be converted to heat or be released from a side face. As a result, the light extraction efficiency is low. In addition, the distance between the organic EL layer and the cathode, which is a metal, is small. Because of this, some of the near-field light from the organic EL layer is converted into surface plasmons on the surface of the cathode conductive layer and lost. As a result, the light extraction efficiency is low:

The light extraction efficiency affects the luminance of a display or an illumination device including the organic light emitting diodes, and thus a variety of techniques for improvement have been studied. One proposed approach to improve the light extraction efficiency is a technique of utilizing surface plasmon resonance. For example, Patent Literatures 1 and 2 disclose techniques for providing a two-dimensional grating structure on the surface of the cathode conductive layer by providing the grating structure on the substrate and stacking layers thereover up to the cathode conductive layer to replicate the grating structure thereon. In the techniques of Patent Literatures 1 and 2, the two-dimensional grating structure provided on the surface of the cathode conductive layer serves as a diffraction grating. This enables extraction of energy, in the form of light, which is otherwise lost as surface plasmons on the surface of the cathode conductive layer. As a result, the light extraction efficiency is improved.

CITATION LIST

Patent Literature

Patent Literature 1: WO 2012/060404
Patent Literature 2: WO 2013/005638
Patent Literature 3: WO 2014/208713

SUMMARY

Technical Problem

In the organic light emitting diode of Patent Literature 1, the two-dimensional grating structure on the substrate is formed such that the period of the recesses and protrusions is constant. This is because the more constant the period of the recessing and protruding structure, the more effectively the light extraction efficiency for specific wavelengths is improved.

However, when a recessing and protruding structure has a constant period, the extraction efficiency is improved mostly for a certain single wavelength, and thus, it is difficult to increase the light extraction efficiency of organic light emitting diodes, given that the target extraction wavelength thereof includes wavelengths over the entire visible light region, namely from 380 nm to 780 nm.

In view of this, Patent Literature 2 discloses an organic light emitting diode including a plurality of protrusions that are two-dimensionally randomly arranged on a substrate. With this organic light emitting diode, because of the random arrangement of the protrusions on the substrate, light over a broad band, over the entire visible light region, can be extracted. As a result, for example, the light extraction efficiency of, for example, white organic light emitting diodes can be improved for the entire wavelength range.

However, the organic light emitting diode of Patent Literature 2 does not enable extraction of light having a high intensity comparable to the intensity that would be achieved by the organic light emitting diode disclosed in Patent Literature 1, which is configured to extract light of a single wavelength by the recessing and protruding structure having a constant period. That is, a high light extraction efficiency over the entire visible light region comparable to that of the organic light emitting diode of Patent Literature 1 cannot be achieved.

Another example of an element including an organic material is an organic photoelectric conversion element, such as an organic thin film solar cell, that operates on a substantially reverse principle to that of the organic light emitting diode. Organic photoelectric conversion elements include an anode conductive layer, a hole extraction layer, an electron blocking layer, an organic semiconductor layer, an electron extraction layer, and a cathode conductive layer, which are stacked over a light-transmissive substrate. The organic semiconductor layer is a conversion layer for converting light into electricity. The organic semiconductor layer includes a pn interface where the electron donor layer (p-layer) and the electron acceptor layer (n-layer) are in contact with each other.

Organic photoelectric conversion elements operate as follows. When sunlight, which is propagating light, enters through the substrate and light energy is provided to the pn interface, the sunlight is absorbed by the electron donor molecules in the organic semiconductor layer to generate excitons. Excitons undergo charge separation at the interface between the electron donor and the electron acceptor, and the electrons are replicated to the electron acceptor. The electrons flow to the cathode and the holes flow to the anode conductive layer. The organic semiconductor layer, because of its properties, is very thin, namely approximately from several tens to two hundred nm thick. Thus, some of the sunlight passes through the organic semiconductor layer and is reflected by the cathode conductive layer, made of metal, and again enters the organic semiconductor layer, passes through the organic semiconductor layer, and is emitted through the substrate to the outside. Thus, effective utilization of the light that is reflected by the cathode conductive layer and enters the organic semiconductor layer is desired.

Patent Literature 3 discloses an organic thin film solar cell including a grating such that a plurality of protrusions are two-dimensionally randomly arranged, similar to that of Patent Literature 2. Such gratings as disclosed in Patent Literatures 2 and 3 are produced by etching using a combination of particles having a small particle size as a mask. The particle size is, for example, 250 nm, 150 nm, or 90 nm. Thus, in the process of forming the organic layer, the recessing and protruding structure can be easily filled by a film forming material for the organic layer or the electrode, and as a result, the original grating shape can be easily lost. In view of this, as with the case where a uniform grating is produced, as disclosed in Patent Literature 1, one possible approach may be to produce a grating by using particles having a relatively large particle size so that the recessing and protruding structure cannot be easily filled. However, the uniform grating can extract only single wavelength, and thus are not necessarily suitable for applications involving the solar spectrum, which is a broad band.

As described above, in the case of organic light emitting diodes, it is desired that light emitted by the organic EL layer be efficiently extracted to the outside for use. Further, for organic photoelectric conversion elements, it is also desired that light energy received in the element be allowed to enter the photoelectric conversion layer effectively to improve the photoelectric conversion efficiency.

In the present disclosure, a substrate, an organic light emitting diode, and an organic photoelectric conversion element that achieve increased efficiency in light energy use are provided. Also, a method for manufacturing such a substrate is provided.

Solution to Problem

According to one aspect of the present invention, a substrate including a recessing and protruding structure on at least a portion of a surface of the substrate is provided. The recessing and protruding structure includes a plurality of protrusions. In plan view of the surface, each of the protrusions has an outline shape including an arc shape. The outline shape includes a first arc portion and a second arc portion. The first arc portion has a center different from a center of the second arc portion. The first arc portion projects in a first direction and the second arc portion projects in a second direction, and the first direction and the second direction are opposite to each other.

According to another aspect of the present invention, a substrate including a recessing and protruding structure on a surface of the substrate is provided. The recessing and protruding structure includes a plurality of overlapping periodic components each having a different period. A surface topography of the recessing and protruding structure has a height distribution, and a power spectrum of the height distribution includes rings, arcs, or a plurality of spots of high intensity, on circumferences of two or more concentric circles of different radii having a center at an origin. The power spectrum is obtained by two-dimensional Fourier transform of the surface topography. The radius of each of the concentric circles ranges from 1.9 $\mu m^{-1}$ to 4.7 $\mu m^{-1}$.

According to another aspect of the present invention, a method for manufacturing a substrate is provided. The method includes forming a recessing and protruding structure including overlapping periods, the periods including a first period of a first periodic recessing and protruding structure and a second period of a second periodic recessing and protruding structure. The first periodic recessing and protruding structure is provided on at least one surface of the substrate and has a first pitch (X). The first pitch (X) is the first period. The second periodic recessing and protruding structure is formed by etching the first periodic recessing and protruding structure through a periodic mask pattern having a second pitch (Y). The second pitch (Y) is the second period. The first pitch (X) and the second pitch (Y) satisfy one of the following relationships: $0 \le (X-Y) < 1.2 \times Y$ and $0 \le (Y-X) < 1.2 \times X$.

According to another aspect of the present invention, a substrate including a recessing and protruding structure on a surface of the substrate is provided. The recessing and protruding structure includes a plurality of protrusions. In plan view of the surface, each of the protrusions each has an outline shape including an arc shape. The outline shape includes a first arc portion and a second arc portion. The first arc portion has a center different from a center of the second arc portion. The first arc portion projects in a first direction and the second arc portion projects in a second direction, and the first direction and the second direction are opposite to each other. The plurality of protrusions include first protrusions and second protrusions, each of the first protrusions being adjacent to a corresponding one of the second protrusions. Center points of the first arc portions of the first protrusions and center points of the first arc portions of the second protrusions collectively form a grating arrangement, and center points of the second arc portions of the first protrusions and center points of the second arc portions of the second protrusions collectively form another grating arrangement. The grating arrangement and the another grating arrangement have an identical grating structure, the grating arrangement and the another grating arrangement are different from each other in grating points, and the grating arrangement and the another grating arrangement have an identical grating pitch.

DESCRIPTION OF EMBODIMENTS

Optical element substrates and optical elements according to embodiments in the present invention will be described with reference to FIGS. 1 to 27.

Substrate Configuration

Figure 1A:
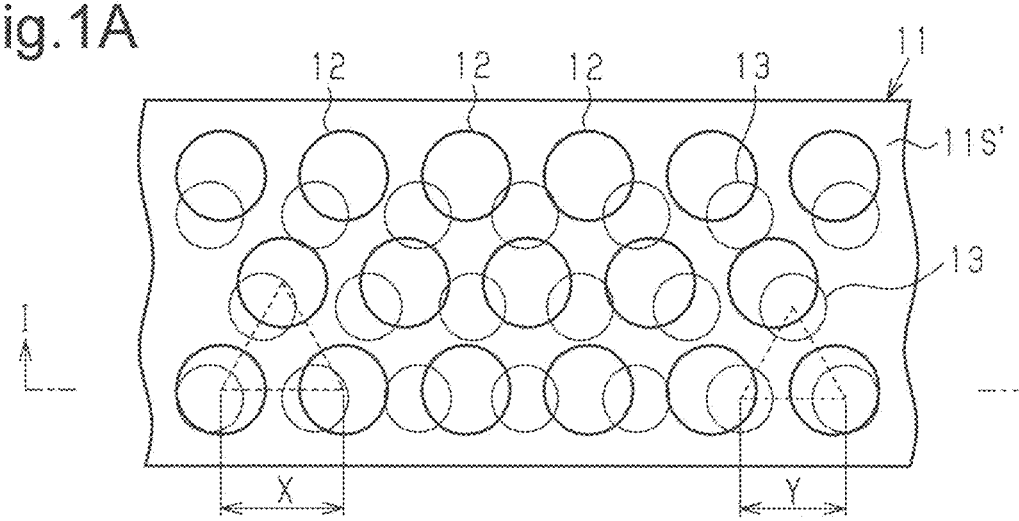
FIG. 1A is a schematic plan view of an optical element substrate according to an example of the present invention, illustrating a state in which a triangular grating of first circular protrusions and a triangular grating of second circular protrusions overlap each other, the first circular protrusions having a radius different from the radius of the second circular protrusions.
Figure 1B:
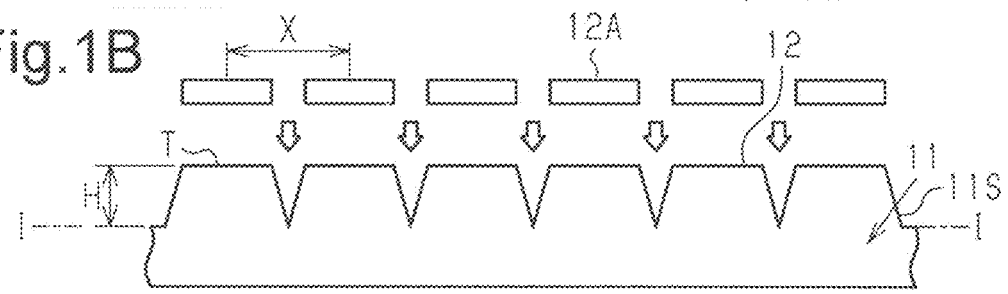
FIG. 1B is a diagram illustrating a state in which a processing surface of the substrate is being etched to form the first circular protrusions through a first periodic mask pattern having a first radius. Further.

As illustrated in FIGS. 1A and 1B, a substrate 11 includes a processing surface 11S, which is a surface. The processing surface 11S is etched to form a protrusion-formed surface 11S'. The substrate 11 can be used in, for example, an organic light emitting diode or an organic thin film solar cell.

The substrate 11 may include inorganic materials, organic materials, and combinations thereof. In a case the material included in the substrate 11 is one or more inorganic materials, examples of the inorganic materials include various types of glass, such as quartz glass, alkali-free glass, alkali glass, and sapphire glass, and transparent inorganic minerals, such as mica. Further examples include opaque inorganic materials, which include metals, such as aluminum, nickel, and stainless steel, and various types of ceramics. In a case the material included in the substrate 11 is one or more organic materials, examples of the organic materials include resin films, such as cycloolefin-based films and polyester-based films, and fiber reinforced plastic materials including fine fibers, such as cellulose nanofibers, mixed with a resin film. The organic materials, too, may include transparent materials and opaque materials.

Figure 2:
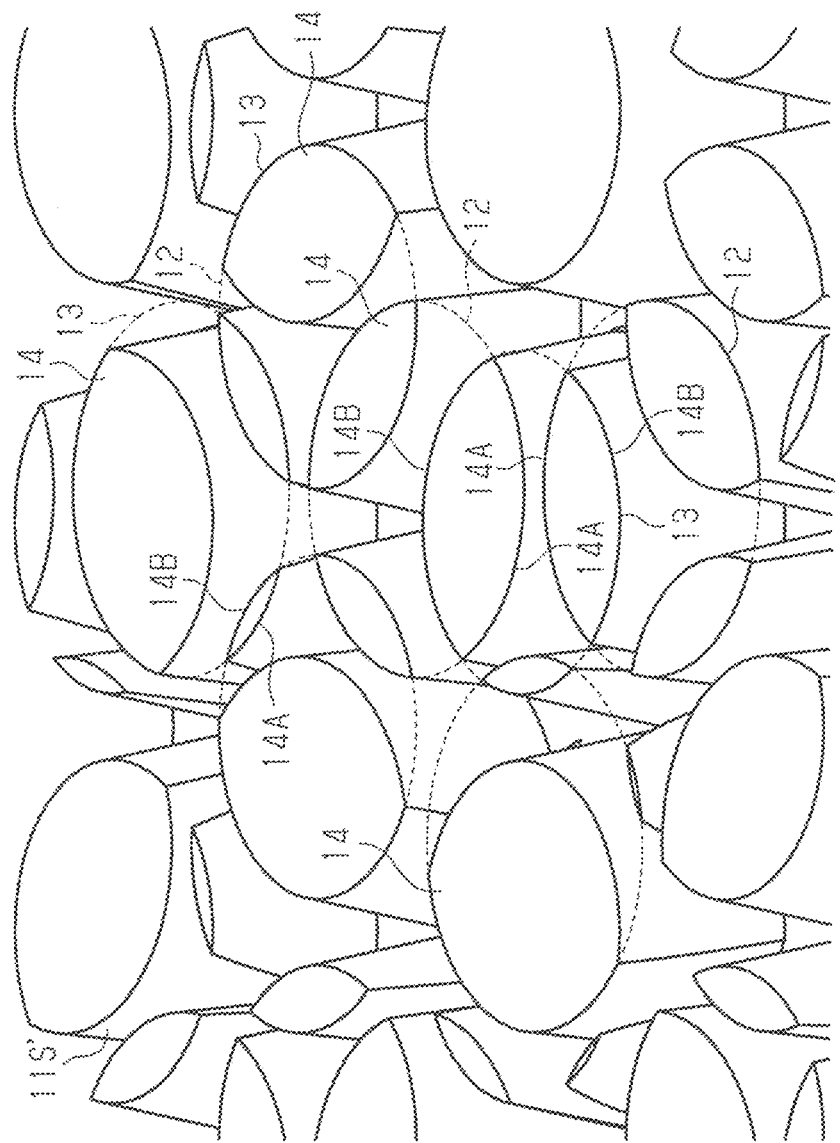
FIG. 2 is a perspective view of the optical element substrate including the triangular grating overlap structure, which is formed from the protrusions including the first arc portions having the first radius and the second arc portions having the second radius.

FIG. 2 is a perspective view of the optical element substrate. The recessing and protruding structure of the protrusion-formed surface 11S' includes a plurality of protrusions 14. The outline of each of the plurality of protrusions 14 includes a first arc portion 14A and a second arc portion 14B. The center position of the first arc portion 14A is different from that of the second arc portion 14B.

In an embodiment of the present invention, the outline of the apex of the protrusion 14 is defined as follows. Measurement with an atomic force microscope (AFM) is performed for any area of the protrusion-formed surface 11S' to determine a modal height Ha of the plurality of protrusions. In an embodiment of the present invention, the outline of the plurality of protrusions 14 is defined as an outline in a cross section of the recessing and protruding structure at a height of Ha×0.9, the cross section being in a plane parallel to the protrusion-formed surface 11S'. The outlines illustrated in FIG. 1A and FIGS. 3A to 3C are outlines at the height (apex) of Ha×0.9.

Figure 3A:
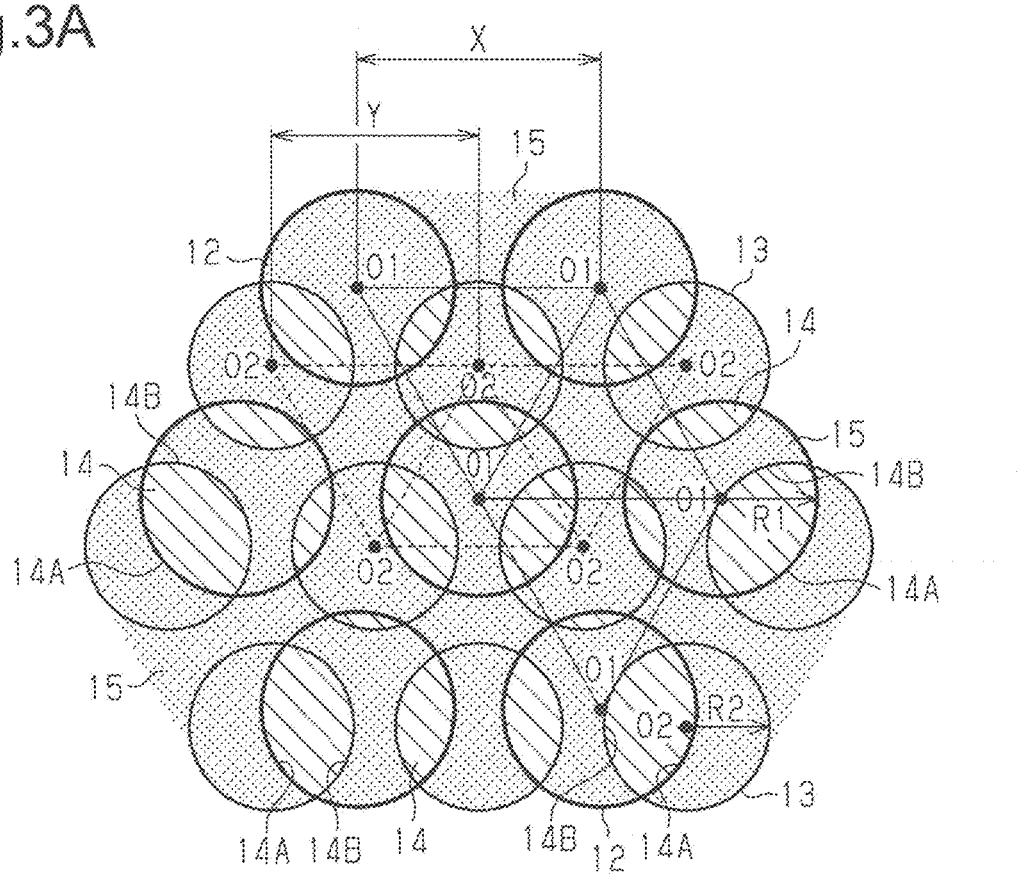
FIG. 3A is an enlarged view of FIGS. 1A and 1s a diagram illustrating an overlap of the arrangement of the first circular protrusions and the arrangement of the second circular protrusions.

FIGS. 1A to 1D illustrate an example of the recessing and protruding structure including the plurality of protrusions 14. FIG. 1A illustrates in plan view a substrate surface of the substrate 11 according to an embodiment of the present invention. FIG. 3A is an enlarged view of FIG. 1A.

The protrusion-formed surface 11S', which is a surface of the substrate 11, includes the plurality of protrusions 14 (hatched portions in FIG. 3A). The plurality of protrusions 14 have a configuration enclosed by the first arc portion 14A and the second arc portion 14B. The first arc portion 14A has a first radius R1 with a first center point O1, and the second arc portion 14B has a second radius R2 with a second center point O2. The first arc portion 14A projects in a direction different from the direction in which the second arc portion 14B projects. Each of the protrusions 14 has a shape similar to an elliptical shape, having sharp edges at both longitudinal ends. The radius of the arc portion is a radius of an imaginary circle having a portion constituted by the arc portion.

Figure 3B:
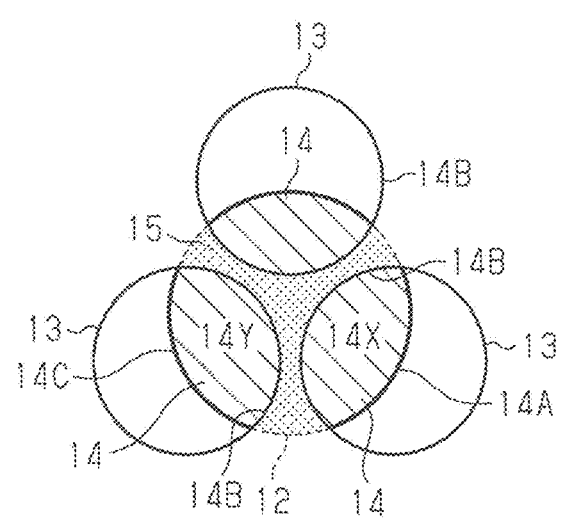
FIG. 3B is a diagram illustrating a relationship between a first extended arc portion and the second arc portion.
Figure 3C:
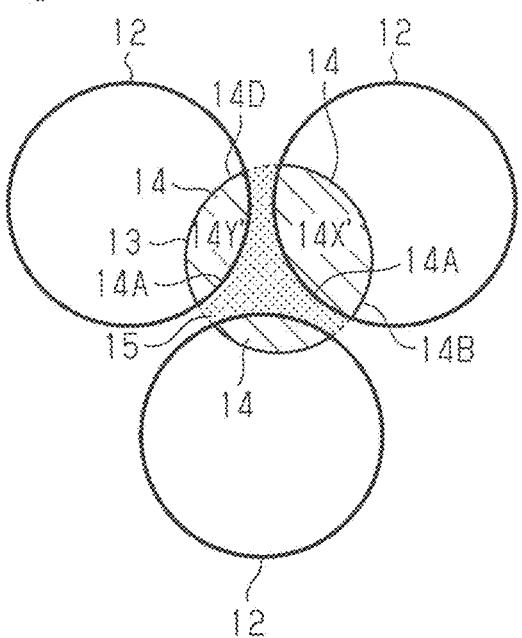
FIG. 3C is a diagram illustrating a relationship between a second extended arc portion and the first arc portion.

FIG. 3B illustrates a first extended arc portion 14C, which constitutes a portion of an extension of the first arc portion 14A. The first arc portion 14A is a portion of the outline of a certain protrusion 14X. The first extended arc portion 14C is a portion of the outline of a protrusion 14Y, which is adjacent to the certain protrusion 14X. FIG. 3C illustrates a second extended arc portion 14D, which constitutes a portion of an extension of the second arc portion 14B. The second arc portion 14B is a portion of the outline of a certain protrusion 14X'. The second extended arc portion 14D is a portion of the outline of a protrusion 14Y', which is adjacent to the certain protrusion 14X'. Even in a case where the outline of the protrusion 14 is partially an incomplete arc, the shape may be assumed to be an arc provided that the shape can be approximated by an arc.

In FIG. 3, the first arc portions 14A constitute part of a plurality of first circular protrusions 12 (bold-line circles in FIGS. 3A to 3C), which are in a triangular grating arrangement on the protrusion-formed surface 11S'. Thus, the first circular protrusions 12 have, for example, a truncated conical shape with the top surface portion having a circular outline shape in plan view of the protrusion-formed surface 11S'. The circular outline shape has the first center point O1 and the first radius R1.

The second arc portions 14B constitute part of a plurality of second circular protrusions 13 (thin-line circles in FIGS. 3A to 3C), which are in a triangular grating arrangement on the protrusion-formed surface 11S'. Thus, the second circular protrusions 13 have, for example, a truncated conical shape with the top surface portion having a circular outline shape. The circular outline shape has the second center O2 and the second radius R2. The second center O2 is located at a different position from the position of the first center O1.

Figure 4:
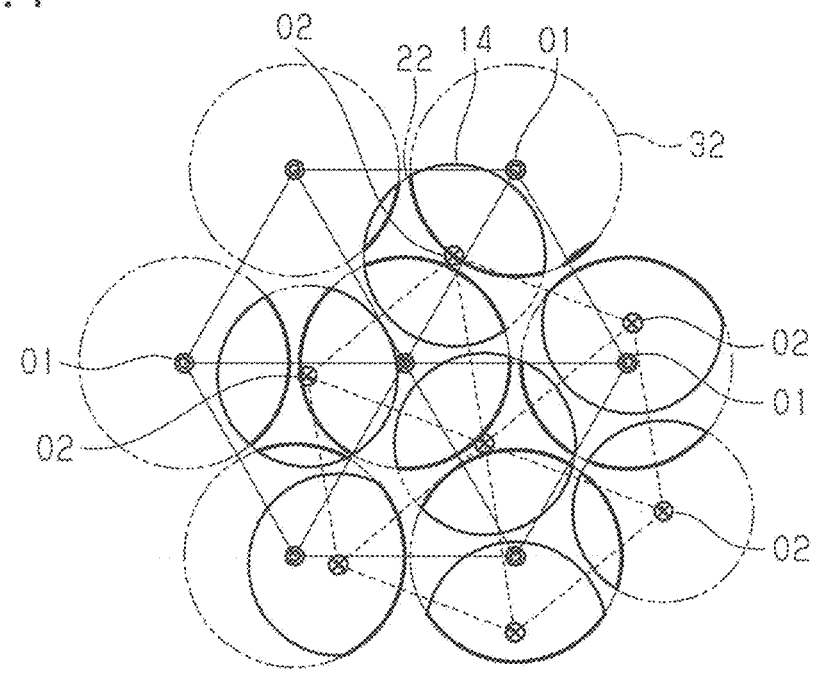
FIG. 4 is a schematic diagram illustrating an example of the structure, in plan view, of an optical element substrate according to an embodiment of the present invention.
Figure 5:
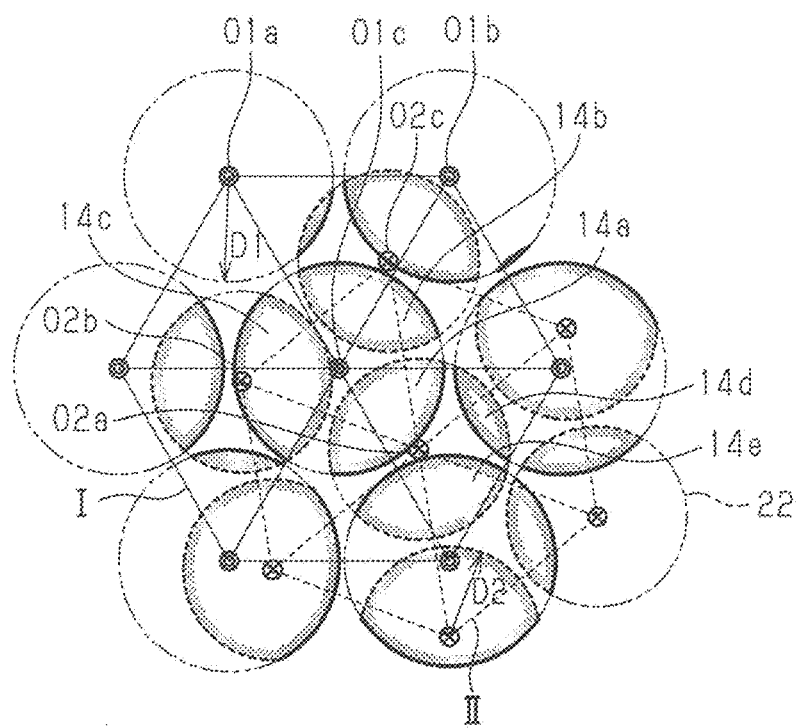
FIG. 5 is a schematic diagram illustrating a relationship between outlines of adjacent protrusions of the optical element substrate according to an embodiment of the present invention.

With reference to FIGS. 4 and 5, features of the outlines of the plurality of protrusions 14 will be described. The outlines are outlines that are identified when an optical element substrate according to an embodiment of the present invention is observed with, for example, an optical microscope, a scanning electron microscope, or an atomic force microscope. For example, in an atomic force microscope image, in which the height difference is displayed as the brightness difference, the peripheral borders of the protrusions 14, which are identified by the brightness difference in the image, are the outlines.

As illustrated in FIG. 4, the outline of the protrusion 14 includes a plurality of arcs. As used in the present application, the term "arc" refers to a portion of the circle circumference of the top surface portion of the truncated cone, which constitutes the first circular protrusion 12 or the second circular protrusion 13, and the term "center point of arc" refers to the center point of an imaginary circle having a portion constituted by the arc. In FIG. 4, one of the arcs that constitute the outline of the protrusion 14 is a portion of a circle 22, which has the second center point O2, and the other of the arcs that constitute the outline of the protrusion 14 is a portion of a circle 32, which has the first center point O1.

With reference to FIG. 5, a positional relationship between the arcs that constitute the outline of the protrusion 14 will be described. A protrusion 14a, a protrusion 14b, and a protrusion 14c, which are adjacent to one another, each have an arc (the portion indicated by the dashed line in FIG. 5) of the outline, with the arcs facing one another. The second center points of the arcs, O2a, O2b, and O2c, are in a triangular grating arrangement.

The protrusion 14a, a protrusion 14d, and a protrusion 14e, which are adjacent to one another, each have an arc that constitutes a portion of the outline. The arcs have a common center point, the second center point O2.

In FIG. 4, the relationship between the protrusion 14 and the first center point O1 is the same as the above-described relationship between the protrusion 14 and the second center point O2, and a plurality of the first center points O1 are in a triangular grating arrangement. That is, the arcs other than the arcs indicated by the dashed lines also have the first center point O1, and the first center points O1 are also in a triangular grating arrangement, which is different from that of the second center points O2.

In the examples of FIGS. 4 and 5, the first center points O1 and the second center points O2 of the arcs are both in a triangular grating arrangement. The present invention also includes an embodiment in which one or both of the first center points O1 and the second center points O2 are in a square grating arrangement.

FIG. 5 illustrates an example including an arrangement I and an arrangement II. The arrangement I is the triangular grating arrangement to which first center points O1a, O1b, and O1c belong, and the arrangement II is the triangular grating arrangement to which second center points O2a, O2b, and O2c of the arcs belong. In the example of FIG. 5, the arrangement I and the arrangement II both have a triangular grating structure, and have different grating axis directions D1 and D2, respectively, and have different arrangement pitches. The arrangement pitch of the center points of the arcs equals the period obtained by two-dimensional Fourier transform of the surface topography of the recessing and protruding structure. In the recessing and protruding structure illustrated in FIG. 5, the grating structures are the same but the grating axis directions are different from each other and the grating pitches are different from each other. Accordingly, the recessing and protruding structure has two types of wave number components and thus corresponds to two types of wavelengths.

This also applies to the case where the grating structures are the same and the grating axis directions are the same but the grating pitches are different from each other. The phrase "grating structures are the same" refers to the case where the arrangement I and the arrangement II are both triangular grating structures or both square grating structures, for example.

In the case where two or more gratings having the same grating structures and the same grating pitches but having different grating axis directions overlap one another, or in the case where the grating structures are the same, the grating axis directions are the same, and the grating pitches are the same, with the only difference being the positions of the grating points, the recessing and protruding structure has one type of periodic component and thus corresponds to one type of wavelength. In this case, the effect produced in correspondence with one type of wavelength of light is greater than the effect produced by a typical, regular recessing and protruding structures including a single grating (see FIG. 10, which will be described later).

It is also possible that the arrangement I and the arrangement II may have different grating structures but may have the same grating pitch. When the grating structures are different from each other, the grating points do not overlap one another, of course. The phrase "grating structures are different from each other" refers to cases where the arrangement I is a square grating structure and the arrangement II is a triangular grating structure, or vice versa. In this case, the grating pitches are different from each other, and the recessing and protruding structure has two types of periodic components and thus corresponds to two types of wavelengths.

It is also possible that the grating structures may be different from each other, the grating axis directions may be different from each other, and the grating pitches may be different from each other. In this case, when the scalar quantities of the basic vectors of the gratings are the same, the recessing and protruding structure has one type of wave number component and thus corresponds to one type of wavelength, or when the scalar quantities are different from each other, the recessing and protruding structure has two types of wave number components and thus corresponds to two types of wavelengths.

The first radius R1 of the first circular protrusions 12 and the second radius R2 of the second circular protrusions 13 may be the same. In the embodiment illustrated in FIGS. 2 and 3A to 3C, however, the relationship between the first radius R1 and the second radius R2 is R1>R2. The ratio of the radius of the first arc portion 14A to the radius of the second arc portion 14B preferably ranges from 1.0 to 5.0, more preferably from 1.0 to 2.5, and even more preferably from 1.0 to 2.2. Still more preferably, the ratio ranges from 1.0 to 2.0. The ratio is determined in view of the use of the recessing and protruding structure as a plasmonic grating.

Thus, the plurality of protrusions 14 are formed by the overlap of the plurality of first circular protrusions 12 with the plurality of second circular protrusions 13. The first circular protrusions 12 are arranged with the period of the first pitch X, and the second circular protrusions 13 are arranged with the period of the second pitch Y. The portions where the first circular protrusions 12 and the second circular protrusions 13 overlap each other form the protrusions 14, and the portions having no overlap form recesses 15 (dotted regions in FIGS. 3A to 3C). The recessing and protruding structure, which includes an overlap of the periodic pattern of the first circular protrusions 12 with the periodic pattern of the second circular protrusions 13, can be formed by etching the processing surface 11S through a plurality of periodic mask patterns each having a different period.

Figure 1C:
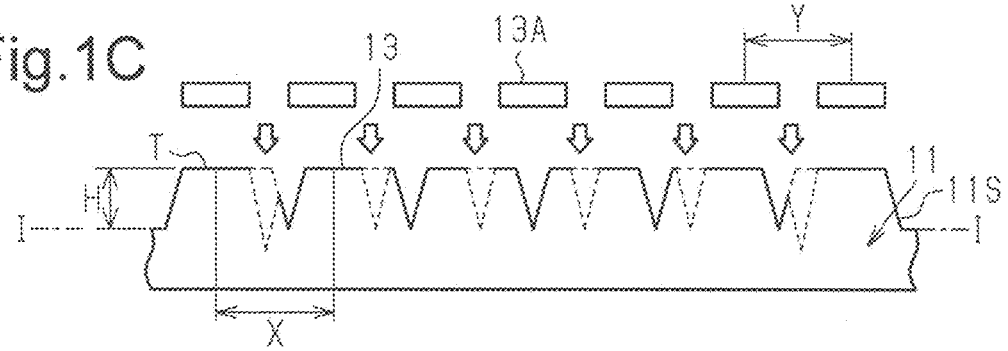
FIG. 1C is a diagram illustrating a state in which the processing surface of the substrate is being etched through a second periodic mask pattern having a second radius.
Figure 1D:
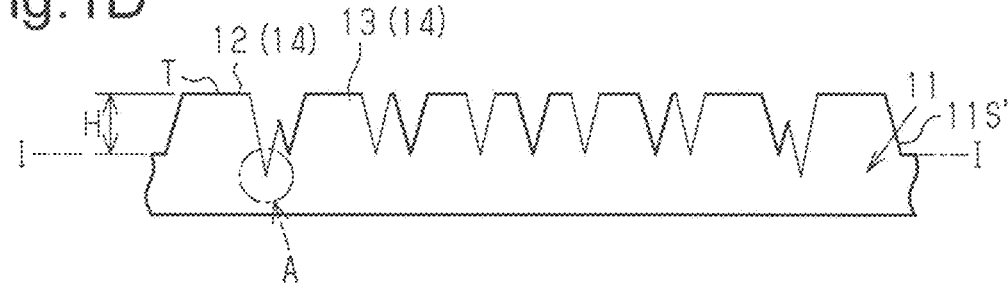
FIG. 1D is a diagram illustrating a state in which the processing surface of the substrate has been etched through the second periodic mask pattern, and is a cross-sectional view of the structure of the protrusions in cross section along line I-I of FIG. 1A, each of the protrusions including a first arc portion having the first radius and a second arc portion having the second radius.

FIG. 1D is a cross-sectional view taken along line I-I of FIG. 1A. FIG. 1B is a diagram illustrating a state in which the processing surface 11S of the substrate 11 is being etched through a first periodic mask pattern 12A, which has an arrangement of the first pitch X. FIG. 1C is a diagram illustrating a state in which the processing surface 11S of the substrate 11 is being etched through a second periodic mask pattern 13A, which has an arrangement of the second pitch Y. The cross-sectional shape illustrated in FIG. 1D can be formed by the following process.

By a first etching, which is performed through the first periodic mask pattern 12A having the period of the first pitch (X), the first circular protrusions 12 having the period of the first pitch (X) are formed on the processing surface 11S. Next, by a second etching, which is performed through the second periodic mask pattern 13A having the period of the second pitch (Y), portions, in the periodic structure of the first circular protrusions 12, surrounded by the dashed lines in FIG. 1C are removed to form a new recessing and protruding structure having the second pitch (Y), which is illustrated in FIG. 1D.

The relationship between the first pitch (X) for the first circular protrusions 12 and the second pitch (Y) for the second periodic mask pattern 13A may be as follows. In the case where the first pitch (X) of the first periodic recessing and protruding structure, which is formed first, is larger than the second pitch (Y) of the second periodic recessing and protruding structure (Y) and thus the first pitch (X) is larger than the second pitch (Y) of the second periodic mask pattern 13A (X>Y), it is preferable that the following relationship be satisfied.

$$0 \leq (X-Y) < 1.2 \times Y$$

On the contrary, in the case where the first pitch (X) of the first periodic recessing and protruding structure, which is formed first, is smaller than the second periodic recessing and protruding structure (Y) and thus the first pitch (X) is smaller than the second pitch (Y) of the second periodic mask pattern 13A (Y>X), it is preferable that the following relationship be satisfied.

$$0 \leq (Y-X) < 1.2 \times X$$

As a result, a recessing and protruding structure including desired periodic components is obtained. When the conditions for the first etching and the conditions for the second etching are the same, the ratio of the radius of the first arc portion 14A to the radius of the second arc portion 14B is substantially equal to the ratio of the arrangement period of the plurality of first circular protrusions 12 to the arrangement period of the plurality of second circular protrusions 13. When the conditions for the first etching and the conditions for the second etching are different from each other, the ratio of the radius of the first arc portion 14A to the radius of the second arc portion 14B can be varied from the ratio of the arrangement period of the plurality of first circular protrusions 12 to the arrangement period of the plurality of second circular protrusions 13.

When the second etching is performed by using a mask having the same radius as that of the first etching conditions, it is preferable that the radius of the arc portions formed under the first etching conditions be from 0.5 to 2 times the radius of the arc portions formed under the second etching conditions. By adjusting the first etching conditions and the second etching conditions to satisfy the above range, a recessing and protruding structure having two distinct wave number components can be formed.

The recessing and protruding structure of FIG. 1D includes unetched portions (T in FIGS. 1B to 1D) as a result of protection by the plurality of periodic mask patterns, such as the first periodic mask pattern 12A and the second periodic mask pattern 13A. By virtue of the unetched portions, the apices of the plurality of protrusions 14, which form the recessing and protruding structure, can be easily positioned in the same plane. Organic EL layers included in organic light emitting diodes and organic semiconductor layers included in organic thin film solar cells are very thin, and the inter-electrode distance is small, namely from several tens to several hundreds nm. Thus, in a case where a protrusion protruding further than other protrusions exists, the protrusion can act as a spike and cause failures such as short circuits and current leakage. In the recessing and protruding structure of the substrate 11 described herein, the apices of the plurality of protrusions are positioned in the same plane. As a result, the occurrence of leakage and/or shorts in the organic EL layers of organic light emitting diodes or the organic semiconductor layers of organic thin film solar cells, formed over the substrate 11, is prevented.

The recesses 15, which are formed as a result of etching, include grooves formed by a first etching step, grooves formed by a second etching step, and grooves formed as a result of the first etching step and the second etching step. Even in a case where the groove depth set for the first etching step and the groove depth set for the second etching step are the same, portions etched through the two etching steps have a greater depth than the other portions (see the portion A in FIG. 1D). The groove depth set for the first etching step and the groove depth set for the second etching step may be different from each other. These groove depths may be set in accordance with the intensity of the target extraction wavelength, for example.

It is preferable that, at the stage of FIG. 1B, the sum of the areas of the unetched portions (T in FIGS. 1B to 1D) is not less than 40% and less than 90% of the area of the processing surface 11S. The reason is as follows. In a case where, at the stage of B, the sum of the areas of the unetched portions is less than 40%, it is difficult to form the grating structure of the first circular protrusions 12 and the grating structure of the second circular protrusions 13 in a manner to clearly separate them from each other, in the etching of C. As a result, at the stage of D, maintaining of the periodicities of the plurality of gratings is difficult. In a case where the sum of the areas is greater than or equal to 90%, there is a possibility that the recesses and protrusions may be filled in the process of producing organic light emitting EL elements, and as a result, the target light extraction effect may be reduced.

In FIGS. 1A to 1D, the first circular protrusions 12 and the second circular protrusions 13 have a substantially conical shape or a substantially truncated conical shape, and the side surfaces are, for example, straight lines or curved lines in vertical cross-sectional view. It is also possible that the corners between the top surfaces and the side surfaces, of the first circular protrusions 12 and of the second circular protrusions 13, may be rounded. It is also possible that the first circular protrusions 12 and the second circular protrusions 13 may have a cylindrical shape or a prism shape. It is also possible that the apices of the first circular protrusions 12 and the second circular protrusions 13 may be flat surfaces, curved surfaces, or rough surfaces.

Figure 6A:
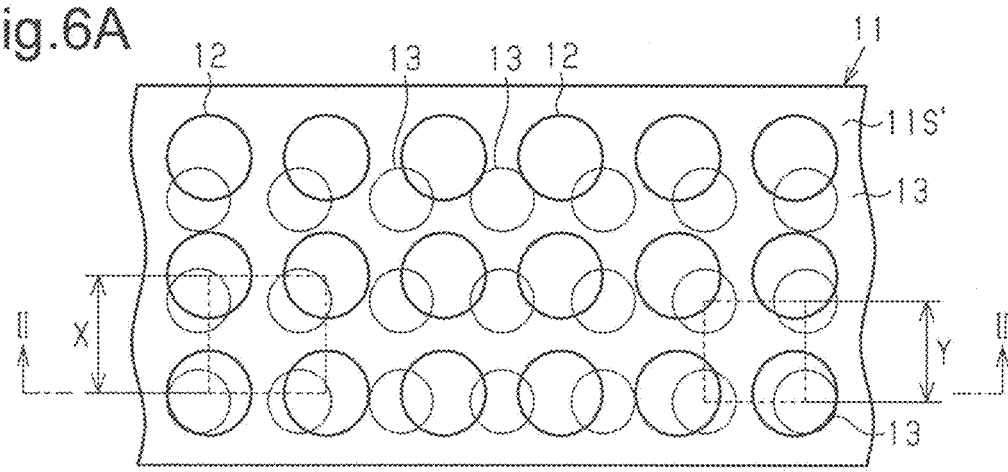
FIG. 6A is a schematic plan view of an optical element substrate, illustrating a state in which a square grating of first circular protrusions and a square grating of second circular protrusions overlap each other, the first circular protrusions having a radius different from the radius of the second circular protrusions.
Figure 6B:
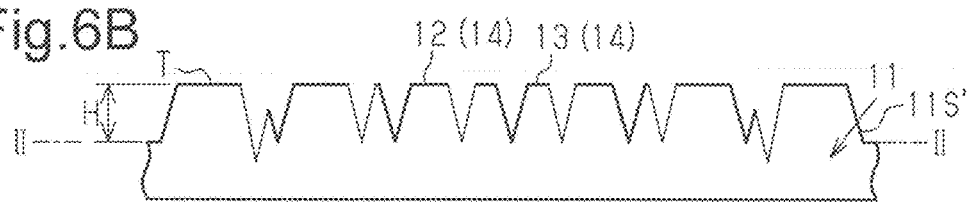
FIG. 6B is an illustration of the structure in cross section.

In FIG. 1A, two triangular grating patterns are illustrated, but as illustrated in FIGS. 6A and 6B, square grating patterns may be possible. Other two-dimensional arrangement patterns may be possible. Of these two-dimensional arrangement patterns, two or more different two-dimensional arrangement patterns may be used in combination.

Examples of the first periodic mask pattern 12A and the second periodic mask pattern 13A, which are used in the etching described above, include a particle monolayer mask formed by a colloidal lithography technique, a resin resist mask formed by a photolithography technique, a resin resist mask formed by a nanoimprinting technique, and a resin resist mask formed by an interference exposure technique. Some of the above-mentioned masks may be used in combination. It is also possible that any of the above-mentioned masks may be formed first and thereafter be replaced with, for example, a metal film mask by using a so-called lift-off technique.

To form the first periodic pattern, etching may not be necessary and, for example, die casting, injection molding, or nanoimprinting may be employed. To form the second periodic pattern, it is preferable to employ dry etching. The dry etching may be performed by using a particle monolayer mask formed by a colloidal lithography technique, a resist mask formed by a photolithography technique, or a resist mask formed by a nanoimprinting technique.

First Pitch X and Second Pitch Y

The first pitch X and the second pitch Y may be determined via a Fourier transform image of an original image of the protrusion-formed surface 11S', which is a two-dimensional image. The first pitch X is a distance between first centers O1 of adjacent ones of the first circular protrusions 12. The second pitch Y is a distance between second centers O2 of adjacent ones of the second circular protrusions 13.

The original image of the protrusion-formed surface 11S' is an image of the depth distribution obtained in plan view of the protrusion-formed surface 11S'. The original image shows the heights or depths of the protrusions using, for example, contrast. The original image may be obtained by, for example, measurement with an atomic force microscope, measurement with a three-dimensional measurement scanning electron microscope (3D-SEM), or measurement with a contact-type step profiler. The plurality of periodic components, each having a different period, can be determined by two-dimensional Fourier transform of the original image of the protrusion-formed surface 11S'. The two-dimensional Fourier transform process is performed by a computer capable of performing a two-dimensional fast Fourier transform.

First, the first pitch X and the second pitch Y may be determined by, for example, image processing the original image described above. The original image is an image of a freely selected portion of the protrusion-formed surface 11S'. The portion has a square shape measuring 5 µm×5 µm.

Next, waveform separation may be performed on the original image by using two-dimensional Fourier transform, to obtain a two-dimensional Fourier transform image based on the original image. The distances between the zeroth-order peak and the first-order peaks in the two-dimensional Fourier transform image may be determined. The reciprocals of the distances are the first pitch X and the second pitch Y in the square portion. In this example, two first-order peaks, corresponding to the first pitch X and the second pitch Y, appear. For example, for each of five or more different square portions, the first pitch and the second pitch Y may be measured. The averages of the obtained measurement values are the first pitch X and the second pitch Y. It is preferable that the space between different square portions be at least 1 mm.

In an organic light emitting diode according to one aspect of the present invention, in the case where the periodic structure is in a triangular grating arrangement, it is preferable that the first pitch X and the second pitch Y each range from 245 nm to 537 nm, and in the case where the periodic structure is in a square grating arrangement, the first pitch X and the second pitch Y each range from 212 nm to 465 nm.

An organic light emitting diode according to one aspect of the present invention includes, over a surface of the substrate, a cathode conductive layer, an anode conductive layer, and an organic semiconductor layer located between the cathode conductive layer and the anode conductive layer. The organic semiconductor layer has an emission wavelength range in the visible light band (wavelength: from 380 to 780 nm). One interface of the cathode conductive layer has a shape such that the grating structure is reflected. The one interface is the interface closer to the organic semiconductor layer.

An organic thin film solar cell according to another aspect of the present invention includes, over a surface of the substrate, a cathode conductive layer, an anode conductive layer, and an organic semiconductor layer located between the cathode conductive layer and the anode conductive layer. The organic semiconductor layer has absorption wavelengths in the visible light band (wavelength: from 380 to 780 nm). One interface of the cathode conductive layer has a shape such that the grating structure is reflected. The one interface is the interface closer to the organic semiconductor layer.

In the case where the periodic structure of the organic light emitting diode or the organic thin film solar cell includes a triangular grating structure, the relationship between the emission peak wavelength (λ) and the pitch (P) of the periodic structure may be $$\lambda = (\sqrt{3}/2) \times P \times n \qquad \text{(Equation 1)}.$$

Satisfying this relationship results in a state in which surface plasmons, which are generated on the surface of the cathode, resonate with light propagating through space. Consequently, for the organic light emitting diode, improvement in light extraction efficiency is achieved, and for the organic thin film solar cell, improvement in photoelectric conversion efficiency is achieved. Here, n is a refractive index of the organic light emitting layer or the organic semiconductor layer.

In the case where the periodic structure includes a square grating structure, the relationship between the emission wavelength (λ) or absorption wavelength (λ) and the pitch (P), of the periodic structure, may be $$\lambda = P \times n \qquad \text{(Equation 2)}.$$

Satisfying this relationship results in an effect similar to the effect described above.

In the case where the refractive index n of the organic semiconductor layer in the organic light emitting diode or the organic thin film solar cell is 1.72, which is a typical value, and the target wavelength range is set to from 365 nm to 800 nm, the first pitch X and the second pitch Y are each adjusted to be in a range of from 245 nm to 537 nm in accordance with the relationship of equation 1, in the case of a triangular grating structure. As a result, for the organic light emitting diode, the luminescence intensity is increased, and for the organic thin film solar cell, the power generation efficiency is increased.

In the case of a square grating structure, the first pitch X and the second pitch Y are each adjusted to be in a range of from 212 nm to 465 nm in accordance with the relationship of Equation 2. As a result, for the organic light emitting diode, the luminescence intensity is increased, and for the organic thin film solar cell, the power generation efficiency is increased.

With the first pitch X and the second pitch Y each being in the above ranges, the periodic structure, when applied to the surface of cathode conductive layer of the organic light emitting diode or the organic thin film solar cell, is suitable for extraction of light in the visible light region. The first pitch and the second pitch are appropriately selected from the above ranges, and the minimum value of the ratio of the first pitch to the second pitch is 1 and the maximum value thereof is 2.5 ($\approx$537 nm/212 nm). When the ratio of the first pitch to the second pitch is close to 1, extraction of two wavelengths of light in a narrow range is achieved. When the ratio of the first pitch to the second pitch is close to the maximum value, extraction of two wavelengths of light on the long wavelength side and on the short wavelength side in the visible spectrum, is achieved.

Regularity of Protrusions

Figure 7:
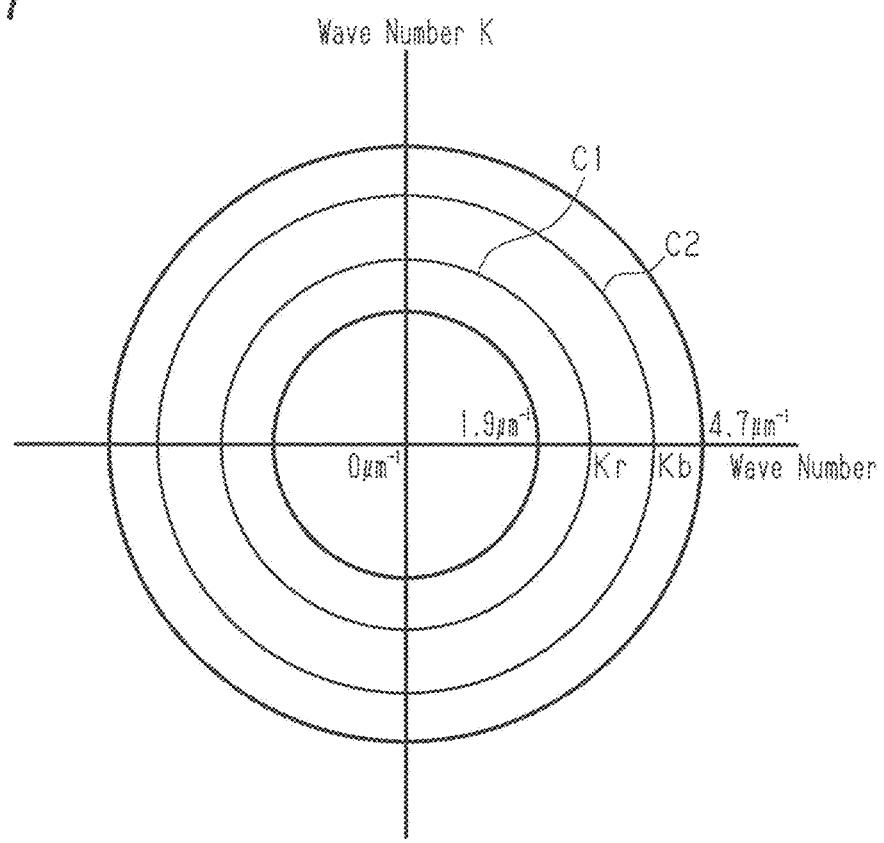
FIG. 7 is a two-dimensional Fourier transform image for illustrating periodic components of the first circular protrusions and second circular protrusions of the recessing and protruding structure included in the substrate.

The periodicities of the first circular protrusions 12 and second circular protrusions 13 of the recessing and protruding structure can be determined by Fourier transform. With reference to FIG. 7, a Fourier transform image of a recessing and protruding structure having two periodic components will be described. Here, the waves of interest in the Fourier transform image are fundamental waves, and not second or higher harmonic waves.

In FIG. 7, wave number components, represented as two concentric circles C1 and C2 with the center being the origin of 0 $\mu m^{-1}$, schematically illustrate positions where power spectral components derived from the two periodicities appear. When an image of the height (depth) distribution of the surface of the recessing and protruding structure undergoes two-dimensional Fourier transform, the power spectral components appear in a pattern (Fourier transform image) of, for example, spots, arcs, or rings, on the concentric circles of high intensities. The pattern of the power spectral components varies depending on the number and variations of the axis directions of the gratings of the recessing and protruding structure and on variations in the pitches.

The spots of high intensities are power spectral components that appear as a result of a two-dimensional Fourier transform of the original image and are in the form of spots. For example, in the case where the arrangement of the recessing and protruding structure is a triangular grating, 6 spots of high intensities appear when there is one crystal lattice axis in the recessing and protruding structure, and a larger number of, e.g., 12 or 18, spots of high intensities appear when there are more than one crystal lattice axes. In the case of using, for example, a resist mask formed by a photolithography technique, a resist mask formed by a nanoimprinting technique that uses a master mold formed by a photolithography technique, or a resist mask formed by an interference exposure technique, in the manufacturing method described above, the crystal axes are oriented in the same direction. As a result, the repetition components of the first circular protrusions 12 or the second circular protrusions 13 in the original image appear as 6 spots of high intensities.

The arcs of high intensities are power spectral components in an arc shape and appear when there are variations in the direction of the crystal lattice axis in the recessing and protruding structure. The rings of high intensities are power spectral components in a ring shape and are generated when there are variations in the direction of the lattice axis to such an extent that the arc region extends to overlap an adjacent arc. In another case, the rings of high intensities are power spectral components in a ring shape and are generated when there are a large number of lattice axes in the original image and the spots of high intensities overlap each other to form a ring. For example, this can occur when the area of the original image is large. In the case of using a particle monolayer formed by a colloidal lithography technique as a mask in the manufacturing method described above, the particle monolayer is a polycrystalline body formed of crystal regions each having a different crystal axis, and as a result, the power spectrum appears as a ring of high intensities. However, even when a particle monolayer is used as a mask, in cases where the area of the original image is small and there are a small number of, e.g., approximately 10, periods in the recessing and protruding structure, the power spectrum may appear as spots of high intensities.

The spots, the arcs, and the rings of high intensities, described above, are also affected by variations in the pitch of the grating points of the recessing and protruding structure. Specifically, when there are large variations in the pitch of the grating points, distribution of the power spectral components in terms of the distance from the origin occurs, and as a result, the spots, arcs, or rings of high intensities may have a large width or a large thickness.

The rings, the arcs, or the plurality of spots of high intensities, which appear on the two concentric circles C1 and C2, appear within a region having a radius ranging from 1.9 $\mu m^{-1}$ to 4.7 $\mu m^{-1}$ with the origin, which has a wave number of 0 $\mu m^{-1}$, being the center. The radius is the absolute value of the wave number, and the region corresponds to the visible light region. In the example of FIG. 1, the original image includes the first period of the first circular protrusions 12, which have the first pitch X and the second period of the second circular protrusions 13, which have the second pitch Y. The second pitch Y is smaller than the first pitch. In the Fourier transform image obtained from such an original image, the first pitch X, which is the larger of the two pitches in the original image, appear as a ring, arcs, or a plurality of spots of high intensities on the concentric circle C1, which is the inner circle, and the second pitch Y, which is the smaller of the two pitches in the original image, appear as a ring, arcs, or a plurality of spots of high intensities on the concentric circle C2, which is the outer circle.

Figure 8:
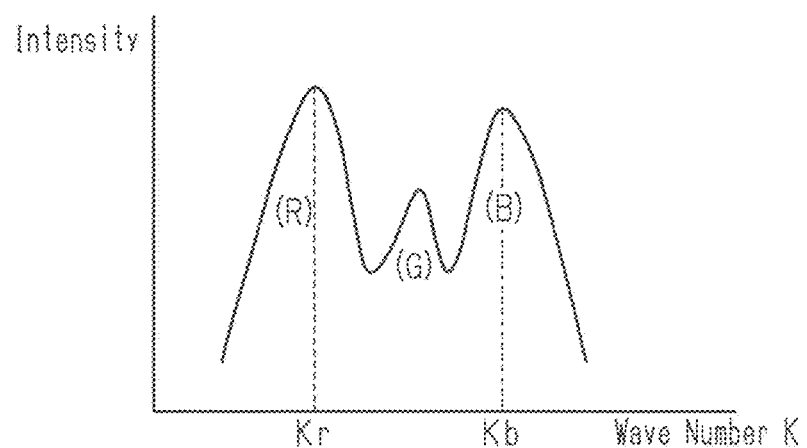
FIG. 8 is a diagram illustrating an example of an emission spectrum of a white organic light emitting diode.

FIG. 8 is a diagram illustrating an example of an emission spectrum of a white organic light emitting diode. R, G, and B in FIG. 8 correspond to the emission components of, a red component, a green component, and a blue component, respectively. In the example of FIG. 8, the first pitch X and the second pitch Y are configured to correspond to the peak wavelengths of the blue component (B) and the red component (R), which have high intensities. As a result, the luminous efficiency and the power generation efficiency are significantly increased.

When it is desired to improve the color rendering properties of a white organic light emitting diode, the pitches of the periodic components of the recessing and protruding structure may be configured to correspond to wavelengths other than the peak wavelengths of the components so that a broad spectrum can be obtained. In this manner, the color tone of the emitted light can be adjusted.

As illustrated in FIGS. 1A to 1D, in the case where the recessing and protruding structure includes a triangular grating structure, an emission peak wavelength ($\lambda r$) on the long wavelength side and the radius (wave number K) of the concentric circle C1 satisfy the following relationship.

$$\lambda r = (\sqrt{3}/2) \times (1/K) \times n$$

Also, an emission peak wavelength (λb) on the short wavelength side and the radius (wave number K) of the concentric circle C2 satisfy the following relationship.

$$\lambda b=(\sqrt{3}/2)\times(1/K)\times n$$

Here, n is a refractive index of the organic semiconductor layer of the organic light emitting diode or the organic thin film solar cell.

As illustrated in FIGS. 6A and 6B, in the case where the grating structure includes a square grating structure, the emission peak wavelength (λr) on the long wavelength side and the radius (wave number K) of the concentric circle C1 satisfy the following relationship.

$$\lambda r=(1/K)\times n$$

Also, the emission peak wavelength (λb) on the short wavelength side and the radius (wave number K) of the concentric circle C2 satisfy the following relationship.

$$\lambda b=(1/K)\times n$$

Here, n is a refractive index of the organic semiconductor layer of the organic light emitting diode or the organic thin film solar cell.

In the case where, as in the related art, protrusions having a single pitch are formed on the protrusion-formed surface 11S' of the substrate 11, a plurality of spots of high intensities appear on the circumference in the Fourier transform image. In the case where, on the protrusion-formed surface 11S' of the substrate 11, there are a large number of microscopic areas in each of which protrusions having a single pitch are arranged and the direction in which the protrusions are arranged differs between the microscopic areas, a ring-shaped power spectrum appears in the Fourier transform image. In the case where the plurality of protrusions are arranged two-dimensionally randomly (in the case where the pitch has a range), a ring-shaped power spectrum having a band shape with a certain width appears in the Fourier transform image.

Operation of Substrate

The substrate 11, configured as described above, can be used as a substrate for organic light emitting diodes or organic thin film solar cells as described below. The case in which the substrate 11, described above, is used as a substrate for an organic light emitting diode is described below. The substrate 11 includes the plurality of protrusions 14, each of which includes the first arc portion 14A and the second arc portion 14B. The first arc portion 14A is included in the first circular protrusion 12 having the first radius R1, and the second arc portion 14B is included in the second circular protrusion 13 having the second radius R2. This configuration increases the light extraction efficiency having a wavelength corresponding to the period of the first circular protrusions 12 and a wavelength corresponding to the period of the second circular protrusions 13.

In a case where the substrate 11 is applied to an organic light emitting diode, the recessing and protruding pattern of the plurality of protrusions 14 is formed on the interface between the organic semiconductor layer and the cathode conductive layer. The plurality of protrusions 14 include the period of the first pitch X in the first circular protrusions 12 and the period of the second pitch Y in the second circular protrusions 13. Thus, in a case where the distance between the light emitting layer in the organic semiconductor layer and the cathode conductive layer is sufficiently small (for example, the distance between the light emitting layer and the cathode conductive layer is not greater than 100 nm, or preferably not greater than 50 nm), surface plasmons corresponding to two wavelengths corresponding to the first pitch X and the second pitch Y can be extracted as radiant light (light propagating through space). Thus, improvement in the light extraction efficiency is achieved. The target wavelength for surface plasmon extraction is not necessarily limited to the peak of the emission spectrum. Any wavelength having at least an emission intensity may be selected. For example, by increasing the extraction efficiency for low-emission intensity wavelengths, the color balance among the emission colors can be adjusted. In particular, extraction of blue, the emission intensity of which is typically low in organic EL, is effectively achieved.

In a case where the substrate 11 is applied to an organic thin film solar cell, the periodic pattern of the first pitch X in the first circular protrusions 12 and the periodic pattern of the second pitch Y in the second circular protrusions 13 are formed on the interface between the organic semiconductor layer and the cathode conductive layer. After sunlight (light propagating through space) enters the organic thin film solar cell, propagating light, in the sunlight, that has a wavelength corresponding to the first pitch X and propagating light, in the sunlight, that has a wavelength corresponding to the second pitch Y are diffracted by the recessing and protruding structure on the interface between the organic semiconductor layer and the cathode conductive layer, to be converted to surface plasmons on the surface of the cathode conductive layer. In a case where the distance between the photoelectric conversion layer in the organic semiconductor layer and the cathode conductive layer is sufficiently small (for example, the distance between the photoelectric conversion layer and the cathode conductive layer is not greater than 100 nm, or preferably not greater than 50 nm), the electromagnetic field of the surface plasmons is incident on the organic semiconductor layer while the surface plasmons are propagating on the surface of the cathode. Thus, the photoelectric conversion efficiency is improved.

As described above, to achieve efficient resonance of surface plasmons in the organic light emitting diode and in the organic thin film solar cell, it is necessary that the distance between the light emitting layer or the photoelectric conversion layer in the organic semiconductor layer and the cathode conductive layer be sufficiently small. The distance is preferably not greater than 200 nm, more preferably not greater than 100 nm, and even more preferably not greater than 50 nm.

Modified Example of Substrate

The substrate 11 described above may be appropriately modified in the following manner and implemented.

Figure 9A:
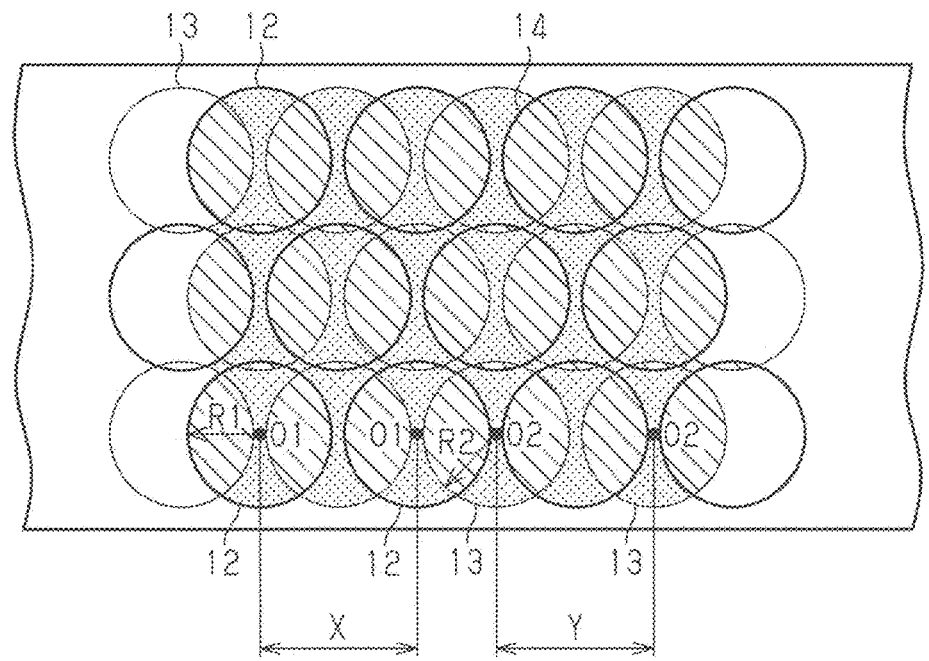
FIG. 9A is a schematic plan view of an optical element substrate according to another example of the present invention, illustrating a state in which a triangular grating of first circular protrusions and a triangular grating of second circular protrusions are displaced from each other in a lateral direction in FIG. 9A and overlap each other, the first and second circular protrusions having the same radius.
Figure 9B:
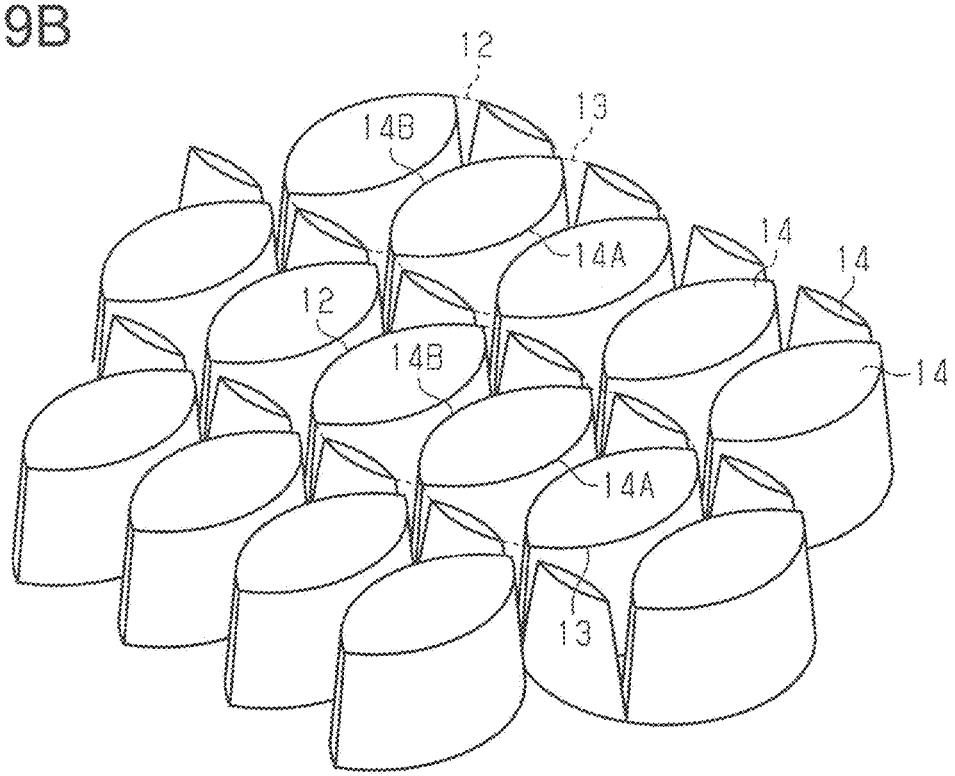
FIG. 9B is a diagram illustrating the structure, in perspective view, of an optical element substrate including a triangular grating structure, which is formed from protrusions each including a first arc portion having a first radius and a second arc portion having a second radius.

As illustrated in FIGS. 9A and 9B, the first arc portions 14A and the second arc portions 14B may have the same radius.

For example, the first pitch X and the second pitch Y may be the same, and the radius of the first circular protrusions 12 and the radius of the second circular protrusions 13 may be the same. Thus, the first circular protrusions 12 have a circular (truncated conical, for example) outline shape with the first center being O1 and the first radius being R1. The second circular protrusions 13 have a circular (truncated conical, for example) outline shape with the second center being O2 and the second radius being R2 (=R1). Thus, the outline shape of the protrusions 14 is formed by two arc portions having the same radius. The second arc protrusions 13 may be the protrusions displaced parallel to the first arc protrusions 12. In such a case, it is preferable that the amount of displacement of the second circular protrusions 13 to the first circular protrusions 12 range from 10% to 90% of the distance between the first center points O1 of adjacent ones of the first circular protrusions 12. In a case where the arrangement of the first circular protrusions 12 and the grating points of the second circular protrusions 13 do not coincide with each other as described above, the light extraction efficiency for a single wavelength corresponding to the pitch is particularly increased. In particular, in the case of a microscopic structure produced by using a particle monolayer as a mask, the triangular grating structure is a polycrystalline body. Thus, by merely performing parallel displacement, overlapping of gratings having different rotation angles is automatically accomplished.

Figure 10:
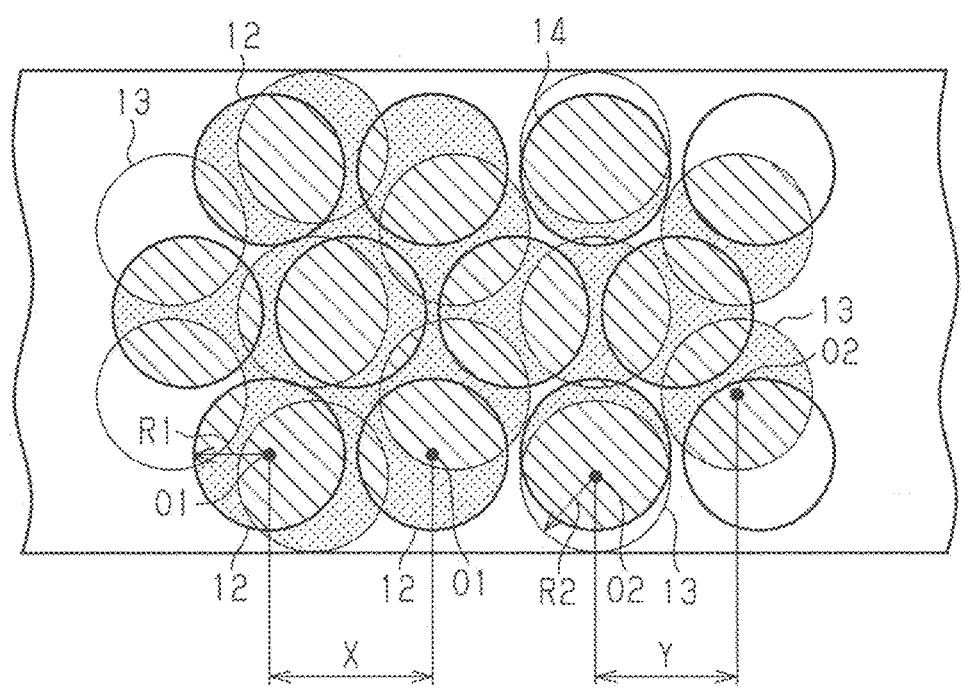
FIG. 10 is a schematic plan view of an optical element substrate according to another example of the present invention, illustrating a state in which a triangular grating of first circular protrusions and a triangular grating of second circular protrusions are displaced from each other in a rotational direction in FIG. 10 and overlap each other, the first and second circular protrusions having the same radius.

As illustrated in FIG. 10, the second arc protrusions 13 may be the protrusions rotated, from the state illustrated in FIG. 9, at a predetermined angle with respect to the first arc protrusions 12. In a case where the first arc protrusions 12 and the second arc protrusions 13 are in triangular grating arrangements, it is preferable that the angle of rotation of the second arc protrusions 13 with respect to the first arc protrusions 12 range from 10° to 50°. When the first arc protrusions 12 and the second arc protrusions 13 are in square grating arrangements, it is preferable that the angle of rotation of the second arc protrusions 13 with respect to the first arc protrusions 12 range from 10° to 80°. In a case where the first circular protrusions 12 and the second circular protrusions 13 have the same grating structure and the same grating pitch and have different grating axis directions, as described above, the light extraction efficiency for a single wavelength corresponding to the pitch is particularly increased.

In a case where the difference between the radius of the first arc portions 14A and the radius of the second arc portions 14B is less than or equal to 30 nm, it may be assumed that the first arc portions 14A and the second arc portions 14B have the same radius.

In a case where the first pitch X and the second pitch Y are the same, and the substrate 11 is used as a substrate for an organic light emitting diode, the light extraction efficiency for a single wavelength corresponding to the pitch is particularly increased.

In a case where the grating structure is a square grating structure, too, the same effect is achieved.

The circular protrusions provided on the protrusion-formed surface 11S' may be three or more types of protrusions, each of the types having a different radius. For example, third circular protrusions may have a third pitch, which may be configured to correspond to the wavelength of green (G) in white light. In a case where such a substrate is used for a light emitting element, the extraction efficiency for the green component is increased. In a case where such a substrate is used for an organic thin film solar cell, even more wavelengths of light in sunlight can be converted to surface plasmons. As a result, the photoelectric conversion efficiency is increased.

The depth of the recesses 15 included in the first circular protrusions 12 and the depth of the recesses 15 included in the second circular protrusions 13 may be the same or may be different from each other. For example, the depth of the recesses 15 may be set in accordance with the extraction wavelength. For an organic light emitting diode, if it is desired to enhance extraction of the blue component (B), one way to achieve this may be to configure the grooves corresponding to the blue component (B) to be deeper than the grooves corresponding to other wavelengths.

First Method for Manufacturing Substrate

A first manufacturing method according to an embodiment of the present invention includes two microfabrication steps for forming the structure of two overlapping periodic patterns for forming the periodic recessing and protruding structure. In the first manufacturing method, the particle size of the particles used in the first microfabrication step is larger than the particle size of the particles used in the second microfabrication step. Other embodiments, however, also include cases in which the particle size of the particles used in the first microfabrication step is smaller than the particle size of the particles used in the second microfabrication step, and cases in which the particle sizes of the particles used in the two steps are the same. The first microfabrication step includes a first particle layer formation step and a first particle etching step, and the second microfabrication step includes a second particle layer formation step and a second particle etching step.

In the first particle layer formation step, a particle monolayer including large-size first particles is formed on the processing surface 11S. In the first particle etching step, the periodic pattern having the first pitch X is formed on the processing surface 11S by etching using the particle monolayer including large-size first particles as a mask.

In the second particle layer formation step, a particle monolayer including second particles is formed on the etched processing surface 11S'. The etching is accomplished in the first particle etching step. In the second particle etching step, the protrusion-formed surface 11S', with the periodic pattern formed thereon, is further etched by using the particle monolayer including second particles as a mask. The periodic pattern is formed by the arrangement of the first circular protrusions 12 having the first pitch X. Thus, a periodic pattern overlap structure is formed. The structure includes the periodic pattern formed by the arrangement of the first circular protrusions 12 and the periodic pattern formed by the arrangement of the second circular protrusions 13.

The steps included in the first manufacturing method will be described below in the order of processing.

First Particle Layer Formation Step

The particle monolayer used in the first microfabrication step includes first particles SL. Examples of materials that may be included in the first particles SL include metals, metal oxides, metal nitrides, metal carbides, organic polymers, other semiconductor materials, and inorganic polymers. It is also possible to use at least two of these materials in combination.

It is preferable that the particle size of the first particles SL range from 245 nm to 537 nm, for example. This is intended to ensure that the first circular protrusions 12 having the size illustrated in the embodiments described above is formed with the periodic pattern of the first pitch X.

For the first particle layer formation step, one of the following methods is used.

Langmuir-Blodgett Method (LB method)
Dip Coating Method
Spin Coating Method
Slit (Die) Coating Method
Particle Adsorption Method (electrical method)
Binder Layer Fixation Method In the LB method, a dispersion containing a dispersion medium and particles dispersed therein is used. The dispersion medium includes a solvent. First, the dispersion is dripped onto the surface of water. Thereafter, the solvent volatilizes from the dispersion, and thus, a particle monolayer including the particles is formed on the water surface.

Subsequently, when the substrate 11 is pulled out of the water, the particle monolayer formed on the water surface is replicated to the processing surface 11S of the substrate 11. Thus, the particle monolayer is formed on the processing surface 11S.

In the dip coating method, a dispersion containing a dispersion medium and particles dispersed therein is used. The dispersion medium includes, for example, water or a solvent. First, the substrate 11 is immersed in the dispersion. Next, the substrate 11 is pulled out of the dispersion to allow a particle monolayer including the particles and the dispersion medium to deposit onto the top surface of the substrate 11. Subsequently, the dispersion medium on the top surface of the substrate 11 is evaporated, and thus, the particle monolayer is formed on the processing surface 11S. The conditions under which the particles form a monolayer depend on, for example, the type and composition of the dispersion medium, the concentration of the dispersion, the substrate 11 pulling rate, and the ambient temperature and moisture at which the dip coating is performed. Thus, these conditions are appropriately adjusted.

In the spin coating method, a dispersion containing a dispersion medium and particles dispersed therein is used. The dispersion medium includes, for example, water or a solvent. First, the substrate 11 is placed on a spin coater and the dispersion is dripped onto the substrate 11. Next, the substrate 11 is rotated and the dispersion is applied uniformly to the processing surface 11S while the dispersion medium in the dispersion is evaporated simultaneously. Thus, a particle monolayer is formed on the processing surface 11S. The conditions under which the particles form a monolayer depend on, for example, the type and composition of the dispersion medium, the concentration of the dispersion, the substrate 11 rotation speed, and the ambient temperature and moisture at which the spin coating is performed. Thus, these conditions are appropriately adjusted.

In the slit coating method, a dispersion containing a dispersion medium particles are dispersed therein is used. The dispersion medium includes, for example, water or a solvent. First, the substrate 11 is placed on a slit coater. Next, the dispersion is applied to the processing surface 11S via a slit to provide a thin film having a uniform concentration. Thus, the dispersion is uniformly coated onto the top surface of the substrate 11. Subsequently, the dispersion medium in the dispersion is evaporated, and thus, a particle monolayer is formed on the processing surface 11S. The conditions under which the particles form a monolayer depend on, for example, the type and composition of the dispersion medium, the concentration of the dispersion, the substrate 11 rotation speed, and the ambient temperature and moisture at which the slit coating is performed. Thus, these conditions are appropriately adjusted.

In the particle adsorption method, first, the substrate 11 is immersed in a suspension including a dispersion medium and colloidal particles. The dispersion medium includes water, for example. Next, a first layer of particles is formed. The first layer of particles includes particles electrically coupled to the processing surface 11S. Further, second and subsequent layers of particles are removed to leave only the first layer of particles. Thus, a particle monolayer is formed on the processing surface 11S.

In the binder layer fixation method, first, a binder layer including a thermoplastic resin is formed on the processing surface 11S of the substrate 11. A dispersion containing particles is applied to the top of the binder layer. Next, the binder layer is softened by being heated to a temperature ranging from the glass transition temperature to the melting temperature, and thus only a first layer of particles is embedded and fixed in the binder layer. Subsequently, the temperature of the substrate 11 is lowered to a temperature less than or equal to the glass transition temperature, and second and subsequent layers of particles are washed away and removed. Thus, a particle monolayer is formed on the processing surface 11S.

It is preferable that the LB method be used as the layer formation method for the first particle layer formation step. The reasons for this include the precision for monolayer formation, the simplicity of operations required to form the layer, the ability to increase the surface area of the first particle layer, and the reproducibility of characteristics of the first particle layer.

Figure 11:
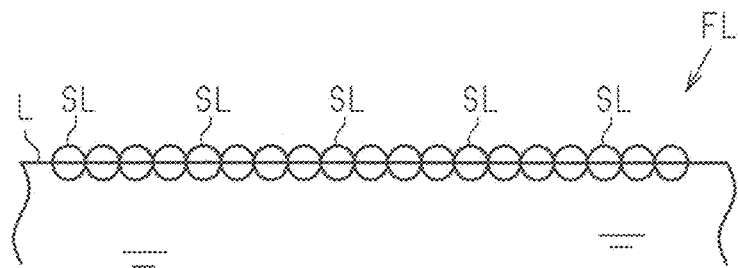
FIG. 11 is a diagram schematically illustrating a step in a method for manufacturing a substrate and illustrates a state of a particle monolayer before being replicated to a processing surface in a first particle layer formation step.

As illustrated in FIG. 11, in the LB method, when the dispersion is dripped onto a water surface L and the solvent in the dispersion volatilizes, the first particles SL spread out into a monolayer on the water surface L. When the first particles SL dispersed on the water surface assemble together, surface tension exists between adjacent first particles SL. The first particles SL are positioned in such a manner that the surface tension is minimized, and as a result, the first particles SL, adjacent to one another, form a two-dimensional hexagonal close-packed structure (triangular lattice geometry) through two-dimensional self-assembly. Consequently, a particle monolayer FL, which includes close-packed particles, is formed.

Figure 12:
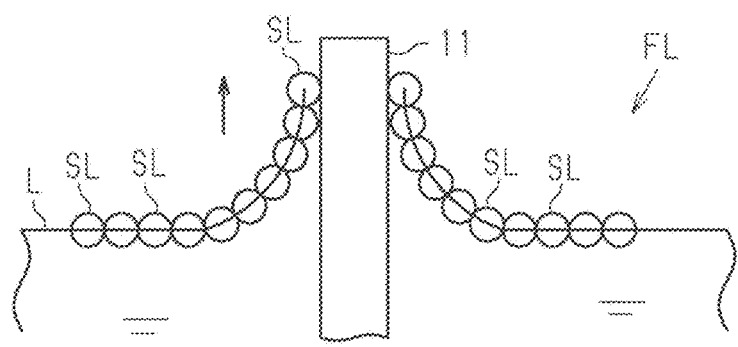
FIG. 12 is a diagram schematically illustrating a step in the method for manufacturing a substrate and illustrates a state of the substrate during transfer of the particle monolayer to the processing surface in the first particle layer formation step.

As illustrated in FIG. 12, in the LB method, the substrate 11 is placed and immersed below the water surface L in advance, and the first particles SL are spread out on the water surface L to form the particle monolayer FL. The substrate 11 is gradually pulled upward, and thus, the particle monolayer FL on the water surface is replicated to the substrate 11. During the operation of transferring the particle monolayer FL to the substrate 11, the moisture contained in the particle monolayer FL evaporates, and finally, the state in which the substrate 11 is coated with the particle monolayer FL, as a monolayer, is reached.

First Particle Etching Step

Figure 13:
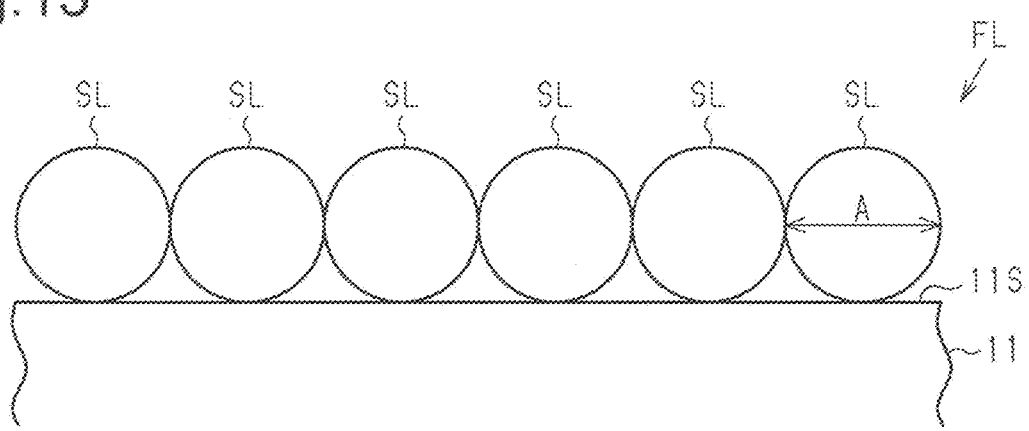
FIG. 13 is a diagram schematically illustrating a step in the method for manufacturing a substrate and illustrates a state of the substrate after transfer of the particle monolayer to the processing surface. The particle monolayer is used in a first particle etching step.

FIG. 13 illustrates a particle monolayer FL formed on a substrate by an LB method. The particle monolayer FL, which includes a monolayer of the first particles SL, is formed on the processing surface 11S. In plan view of the processing surface 11S, the particle monolayer FL has a triangular lattice structure in which the first particles SL are closely packed.

Figure 14:
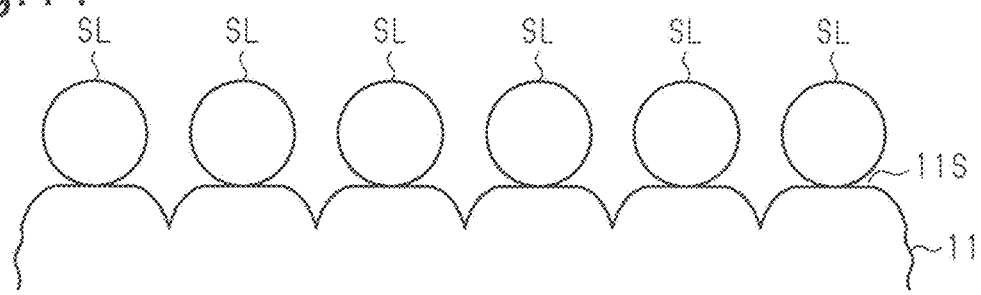
FIG. 14 is a diagram schematically illustrating a step in the method for manufacturing a substrate and illustrates the shapes of the particle monolayer and the substrate during etching of the substrate in the first particle etching step.

In the first particle etching step, the periodic grating structure may be formed on the processing surface 11S of the substrate 11 by performing dry etching on the processing surface 11S by using the particle monolayer FL as a mask. Specifically, as illustrated in FIG. 14, at the start of dry etching, the etching gas flows through the spaces between the first particles SL, which are included in the particle monolayer. The etching gas reaches the surface of the substrate 11 to form grooves in the portions, so that protrusions appear on the center positions, on which the first particles SL are disposed. As the dry etching proceeds, the first particles SL on the protrusions are gradually etched and become smaller, and the grooves in the substrate 11 also become deeper. As a result, a large number of recesses and protrusions are formed on the processing surface 11S of the substrate 11. The shape of the periodic grating structure can be adjusted by varying the conditions, such as the type of dry etching gas, the gas flow rate, the applied power to the upper electrode (source power), the applied power to the lower electrode (bias power), the pressure within the etching chamber, the type and amount of deposition gas to be added.

Examples of gases that may be used in the dry etching include Ar, $SF_6$, $F_2$, $CF_4$, $C_3F_8$, $C_5F_8$, $C_2F_6$, $C_3F_6$, $C_4F_6$, $CHF_3$, $CH_2F_2$, $CH_3F$, $CH_4$, $C_4F_8$, $Cl_2$, $CCl_4$, $SiCl_4$, $BCl_2$, $BCl_3$, $BF_3$, $BC_2$, $Br_2$, $Br_3$, HBr, $CBrF_3$, HCl, $CH_4$, $NH_3$, $O_2$, $H_2$, $N_2$, CO, and $CO_2$. One or more of these gases may be used in accordance with, for example, the material of the particles included in the particle monolayer etching mask and of the substrate.

Examples of the material of the substrate 11 include various types of glasses, artificial quartz, mica, metal oxides such as sapphire ($Al_2O_3$), and polymeric materials, such as polyethylene terephthalate (PET), polyethylene naphthalate, triacetyl cellulose, and alicyclic polyolefins. As necessary, the surface of the substrate may be coated with another material or may be chemically converted.

It is also possible that a master mold may be produced first and a replica mold of the master mold may be produced to fabricate a resin molded article by a method using the replica mold. The method may be an injection molding method, a thermal nanoimprinting method, a photonanoimprinting method, a hot-press method, or a UV embossing method. In such a case, examples of the material of the master mold include silicon, compounds such as silicon carbide, quartz glass, and sapphire glass, and various types of metals such as copper and aluminum. The method for producing the replica mold may be, for example, an electroforming method, a thermal nanoimprinting method, or a photo-nanoimprinting method. Preferred examples of the material of the replica mold include metals such as nickel, thermoplastic resins such as alicyclic polyolefins, and photocurable resins such as resist resins.

In the first particle etching step, after the start of the etching of the processing surface 11S, the etching of the processing surface 11S is stopped before the first particles SL, which are included in the particle monolayer FL, disappear as a result of etching. Thereafter, the particle monolayer FL is removed from the processing surface 11S. Specifically, the step of removing the particle monolayer FL may be performed as follows. The particle monolayer FL may be physically removed by using a process such as ultrasonic cleaning at a frequency ranging from 30 kHz to 1.5 MHz, or preferably from 40 kHz to 900 kHz, or high-pressure cleaning at a pressure ranging from 1 MPa to 15 MPa. or preferably from 5 MPa to 15 MPa. The particle monolayer FL may be physically removed by using a process such as wiping, which is specifically contact cleaning using, for example, cotton cloth or a PVA or nylon brush. The particle monolayer FL may be chemically removed exclusively and selectively by using a process such as dry etching using a gas such as $CF_4$ or wet etching using HF, for example. In this case, regions, of the processing surface 11S, that face the first particles SL until immediately before the removal of the particle monolayer FL are not etched. As a result, the regions become flat portions. With this production method, a prototype of the first circular protrusions 12 each having a flat end portion is formed.

Figure 15:
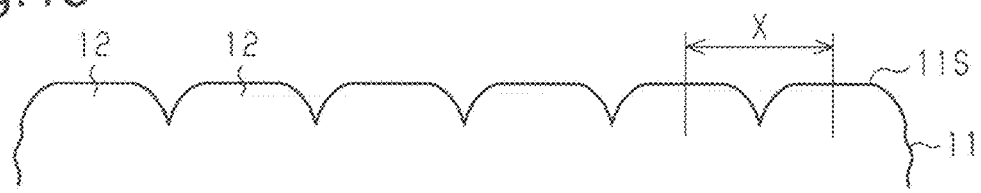
FIG. 15 is a diagram schematically illustrating a step in the method for manufacturing a substrate and illustrates the shape of the substrate after being etched in the first particle etching step.

As illustrated in FIG. 15, the first pitch X of the first circular protrusions 12 is similar to the distance between adjacent ones of the first particles SL in the particle monolayer FL. Also, the arrangement of the first circular protrusions 12 is similar to the arrangement of the first particles SL.

Second Particle Layer Formation Step

Second particles SS, which are to be included in a particle monolayer, are used in the second particle layer formation step. The second particles SS have a particle size smaller than the particle size of the first particles SL. The material of the second particles SS may be any of the various materials illustrated for the first particle layer formation step described above. The method for forming the particle monolayer in the second particle layer formation step may be any one of the methods illustrated in the description of the first particle layer formation step.

It is preferable that the particle size of the second particles SS, for example, range from 245 nm to 537 nm in order to provide the structure of the second circular protrusions 13, which have a size different from the size of the first circular protrusions 12 having the first pitch X. A particle mask including the plurality of second particles SS, which have a particle size (B), are placed over the formed mold of the first circular protrusions 12, and etching is performed. The formation of the formed mold is accomplished by using the first particles SL, which have a particle size (A), as a mask. The period of the first circular protrusions 12 is the pitch (A). The relationship between the first particle size (A) of the first particles SL and the second particle size (B) of the second particles SS satisfies the following.

$$0 \le (A-B) < 1.2 \times B$$

As a result, the first circular protrusions 12, which have a period of the first pitch X, are formed, and the second circular protrusions 13, which have a period of the second pitch Y, are formed to overlap the first circular protrusions 12.

Satisfying the relationship $(A-B)<1.2 \times B$ inhibits the second particles SS from falling into the recesses formed by the plurality of first circular protrusions 12, and enables formation of a uniform particle monolayer. Thus, it is preferable to satisfy the relationship. The use of the uniform monolayers as masks facilitates production of a recessing and protruding structure including desired periodic components. It is more preferable that the relationship between the first particle size (A) of the first particles SL and the second particle size (B) of the second particles SS be $0 \le (A-B) < 1.0 \times B$.

In the second particle layer formation step, a particle monolayer FS, which includes the second particles SS, is formed on the processing surface 11S, which includes the first circular protrusions 12 formed thereon. The particle monolayer S may be formed by any one of the particle monolayer formation methods illustrated for the first particle layer formation step. A preferable method for forming the particle monolayer FS on the processing surface 11S is an LB method, as with the first particle layer formation step. The various conditions that may be applied to the particle monolayer FS formation method may be similar to the conditions illustrated for the first particle layer formation step.

Second Particle Etching Step

Figure 16:
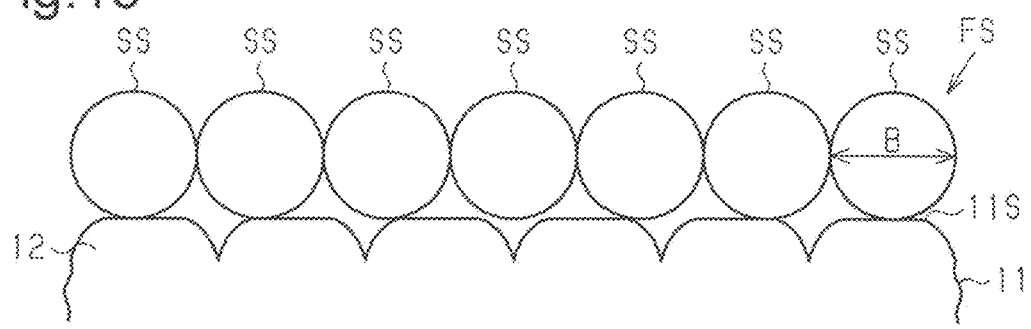
FIG. 16 is a diagram schematically illustrating a step in the method for manufacturing a substrate and illustrates a state of the substrate after transfer of a particle monolayer to the processing surface. The particle monolayer is used in a second particle etching step.

As illustrated in FIG. 16, the particle monolayer FS, which includes a monolayer of the second particles SS, is formed on the processing surface 11S. The processing surface 11S includes the first circular protrusions 12 formed thereon by the first particle etching step. In plan view of the processing surface 11S, the particle monolayer FS has a structure in which the second particles SS are closely packed. The second particles SS are disposed to overlap the flat outer surfaces of the first circular protrusions 12. In the second particle etching step, the processing surface 11S is etched by a similar process to that of the first particle etching step and by using the second particles SS as a mask.

Figure 17:
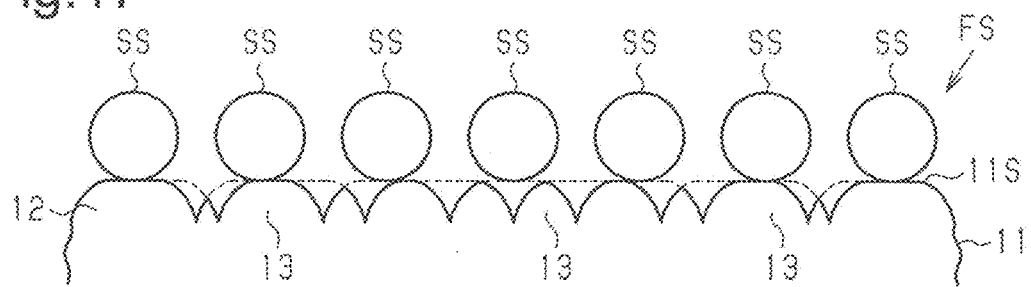
FIG. 17 is a diagram schematically illustrating a step in the method for manufacturing a substrate and illustrates the shapes of the particle monolayer and the substrate during etching of the substrate in the second particle etching step.

It is preferable that the second particle etching step be performed as follows. As illustrated in FIG. 17, after the start of the etching of the processing surface 11S, the etching of the processing surface 11S is stopped before the second particles SS, which are included in the particle monolayer FS, disappear as a result of etching. Thereafter, the particle monolayer FS is removed from the processing surface 11S. In this case, portions immediately below those regions of the processing surface 11S that face the second particles SS until immediately before the removal of the particle monolayer FS are not etched. As a result, the flat portions of the first circular protrusions 12 are maintained. The second circular protrusions 13 are formed in this manner. The apices of the second circular protrusions 13 lie in the same plane as the flat portions of the first circular protrusions 12.

Thus, it is preferable that the apices of the second circular protrusions 13 and the apices of the first circular protrusions 12 before the second particle etching step be flat portions that lie in the same plane. In the second particle etching step, etching is stopped while the flat portions of the apices of the first circular protrusions 12 still remain. As a result, the flat portions on the apices of the protrusions 14 lie in the same plane more satisfactorily. In thin-film devices, such as organic light emitting diodes and organic thin film solar cells, the flatness of a substrate used is important. In a case that large protrusions, having a height approximately as large as the inter-electrode distance, are present on the substrate, this can result in the occurrence of short-circuiting between the electrodes or the occurrence of leakage current. As a result, the ability of the device significantly decreases. Therefore, in present embodiments, measures are taken to reduce defects that may occur in the organic layer and the electrode layer that are to be stacked. Specifically, the apices of the first circular protrusions 12 and the second circular protrusions 13, which are used as a stamper for forming the substrate or the recessing and protruding structure, are configured to be flat, so that the apices of the thus formed protrusions 14 can lie in the same plane.

The outline of the protrusions 14 may be determined as follows.

First, the modal height Ha is determined by performing measurement with an atomic force microscope on any area of the protrusion-formed surface 11S' including the recessing and protruding structure, and generating a height distribution curve of the area. For measurement of the modal height Ha, it is preferable that the measurement be performed on a surface, of the recessing and protruding structure, that includes at least 100 protrusions.

Figure 18A:
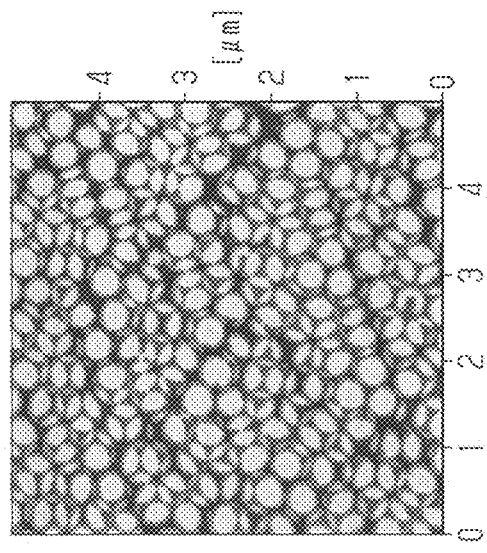
FIG. 18A is a diagram illustrating a graph of protrusion height-frequency distribution.
Figure 18B:
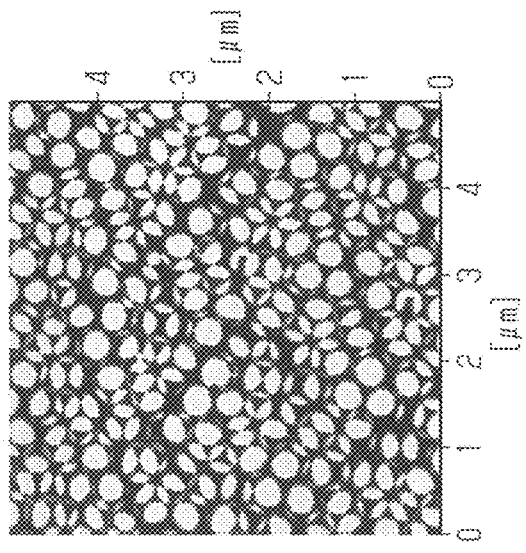
FIG. 18B is an atomic force microscope image showing height profiles of the apices of the first circular protrusions and the second circular protrusions.
Figure 18C:
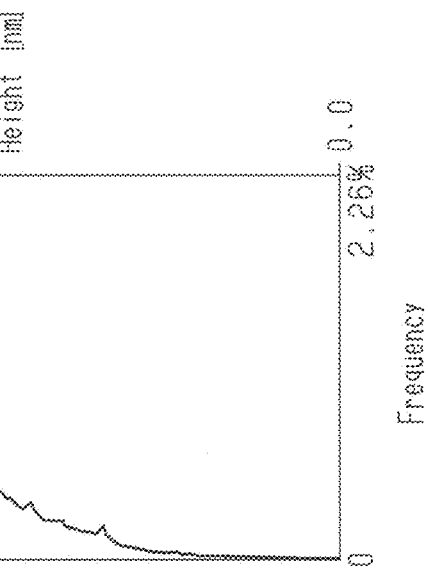
FIG. 18C is a binary image with a threshold at a height of Ha×0.9.

Next, assuming that the portions having a height of 0.9 Ha or greater are the apices of the protrusions, an adjustment is made so that the outline of the height 0.9 Ha appears. The outline that appears may be observed as the outline of the protrusion. FIG. 18A is a diagram illustrating a graph of a protrusion height-frequency distribution on the surface of an optical element substrate according to an embodiment of the present invention. The measurement is made with an atomic force microscope. In this example, the modal height Ha is 133 (132.72) nm and the height 0.9 Ha is 119 (119.45) nm. FIG. 18B is an atomic force microscope image showing the height profiles of the apices of the first circular protrusions and the second circular protrusions. FIG. 18C is a binary image with a threshold at a height of Ha×0.9. The outlines of the protrusions are shown as arc patterns.

It is preferable that the apices of the protrusions substantially lie in the same plane. In the relationship between the modal height Ha and the maximum height Hmax, when 1.1 Ha>Hmax is satisfied, it may be assumed that the apices of the protrusions substantially lie in the same plane.

In the binary image of atomic force microscope, the area percentage of the height 0.9 Ha is preferably not less than 10% to less than 70%, more preferably not less than 20% to less than 60%, and even more preferably not less than 30% to less than 50%. In a case where the area percentage is less than 10%, it is difficult to form the grating structures in a manner to clearly separate them from each other. As a result, maintaining of the periodicities of the plurality of gratings is difficult. On the other hand, in a case where the area percentage is greater than or equal to 70%, the protrusions are excessively close to each other. Thus, maintaining of the individual protrusions as independent structures is difficult.

Figure 19A:
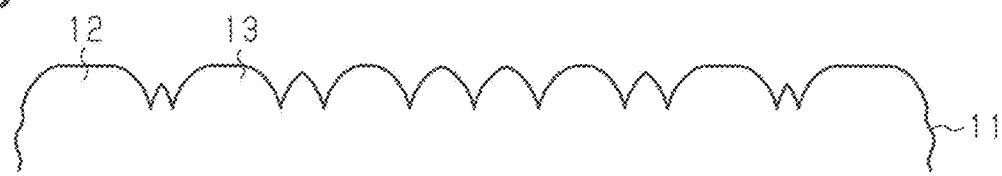
FIG. 19A is an illustration of the shape of the substrate after being etched in the second particle etching step.
Figure 19B:
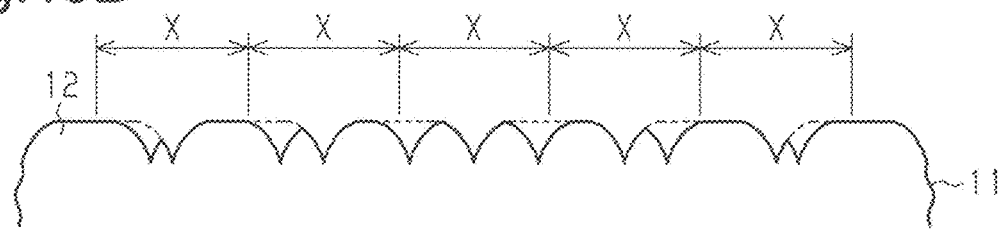
FIG. 19B is an illustration of a first pitch X.
Figure 19C:
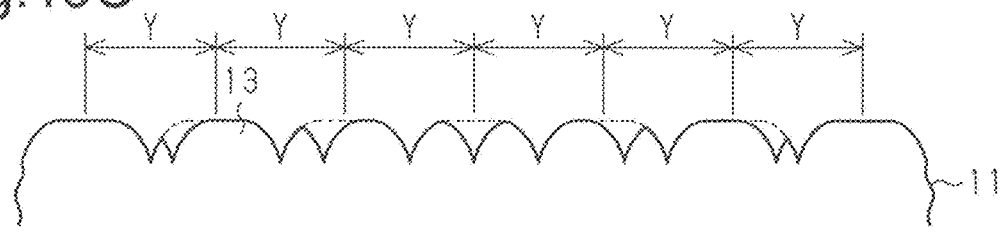
FIG. 19C is an illustration of a second pitch Y.

FIG. 19A is a schematic illustration of a recessing and protruding structure produced by the manufacturing method described above. The structure in FIG. 19A is a structure, wherein the first circular protrusions 12 having the first pitch X illustrated in FIG. 19B and the second circular protrusions 13 having the second pitch Y illustrated in FIG. 19C overlap each other. The power spectrum of the height distribution obtained by two-dimensional Fourier transform of the surface topography of the structure of FIG. 19A indicates the periodicities corresponding to both the pattern of the first particles SL arrangement and the pattern of the second particles SS arrangement.

In FIGS. 1 and 19, the grating axis direction (period direction) of the first pitch X and the grating axis direction of the second pitch Y are the same. It is also possible that, in the recessing and protruding structure of the substrate according to an embodiment of the present invention, the grating axis direction of the first pitch X and the grating axis direction of the second pitch Y may be different from each other in the same plane of the substrate.

Second Method for Manufacturing Substrate

In the examples described above, the first particle layer formation step is performed first and thereafter the second particle layer formation step is performed. Conversely, the second particle layer formation step may be performed first and thereafter the first particle layer formation step may be performed, to form the protrusions 14. The steps included in the second manufacturing method will be described below in the order of processing.

Second Particle Layer Formation Step

The particle monolayer FS used in the second manufacturing method includes the second particles SS. The particle size and the material of the second particles SS may be the same as the particle size and the material illustrated for the first manufacturing method described above. In the second particle layer formation step, the particle monolayer FS, which includes the second particles SS, is formed on the processing surface 11S by the same method as the particle monolayer formation method illustrated for the first manufacturing method.

Second Particle Etching Step

Figure 20:
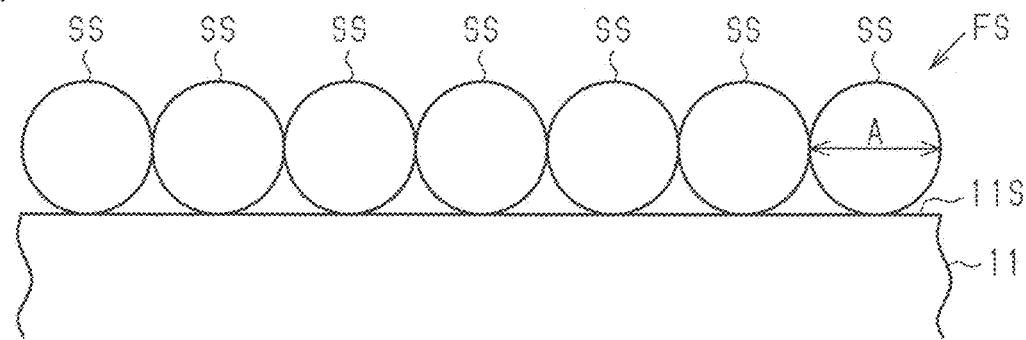
FIG. 20 is a diagram schematically illustrating a step in a different method for manufacturing a substrate and illustrates a state of the substrate after transfer of the particle monolayer to the processing surface. The particle monolayer is used in the second particle etching step.

As illustrated in FIG. 20, the particle monolayer FS, which includes a monolayer of the second particles SS, is formed on the processing surface 11S. In plan view of the processing surface 11S, the particle monolayer FS has a structure in which the second particles SS are hexagonally packed.

Figure 21:
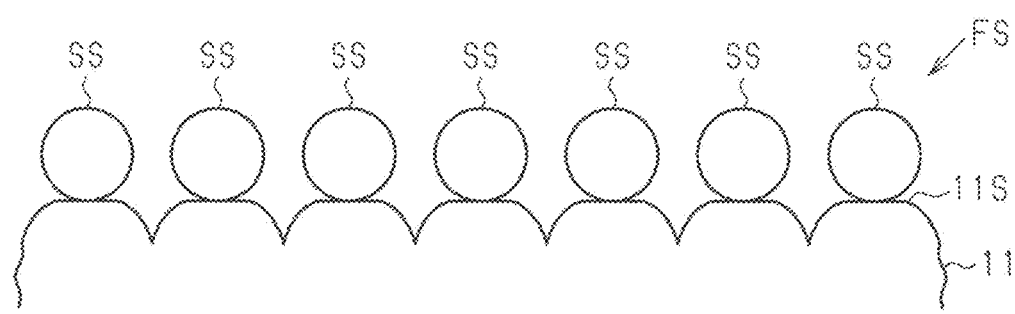
FIG. 21 is a diagram schematically illustrating a step in the different method for manufacturing a substrate and illustrates the shapes of the particle monolayer and the substrate during etching of the substrate in the second particle etching step.

As illustrated in FIG. 21, in the second particle etching step, first, the processing surface 11S is etched by using the second particles SS as a mask. As the second particles SS are consumed (particle size shrinks) during the etching, regions between adjacent second particles SS become regions not protected by the particles, and such regions of the processing surface 11S also begin to be etched. After the start of the etching of the processing surface 11S, the etching of the processing surface 11S is stopped before the second particles SS, which are included in the particle monolayer FS, disappear as a result of etching. Thereafter, the second particles SS are removed from the processing surface 11S.

Figure 22:
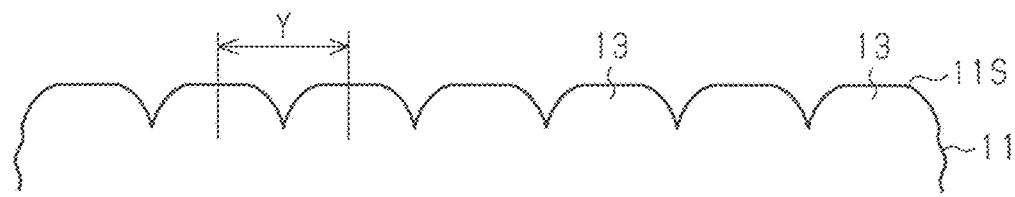
FIG. 22 is a diagram schematically illustrating a step in the different method for manufacturing a substrate and illustrates the shape of the substrate after being etched in the second particle etching step.

As illustrated in FIG. 22, as a result of etching using the second particles SS as a mask, the second circular protrusions 13 are formed immediately below the second particles SS on the processing surface 11S. Regions, of the processing surface 11S, that face the second particles SS until immediately before the removal of the second particles SS are not etched. As a result, the regions become flat portions.

The etching conditions for etching the processing surface II 1S are appropriately adjusted in the same manner as with the first manufacturing method.

First Particle Layer Formation Step

The particle monolayer used in the second manufacturing method includes the first particles SL.

The particle size and the material of the first particles SL may be the same as the particle size and the material illustrated for the first manufacturing method. In the first particle layer formation step, the particle monolayer FL, which includes the first particles SL, is formed on the processing surface 11S by the same method as the particle monolayer formation method illustrated for the first manufacturing method. The processing surface 11S includes the second circular protrusions 13 formed thereon. In the first manufacturing method, the size of the second particles SS, which are placed on the first circular protrusions 12, is smaller than the size of the first circular protrusions 12. In the second manufacturing method, the size of the first particles SL, which are placed on the second circular protrusions 13, is larger than the size of the second circular protrusions 13. Thus, compared with the first manufacturing method, in the second manufacturing method, the particle monolayer FL, which is formed on the processing surface 11S after formation of the second circular protrusions 13, tends to be flat easily, and as a result, the particles can be easily positioned in a regular manner on the processing surface 11S. As a result, in the second method, the uniformity of the arrangement of the recessing and protruding structure on the processing surface 11S may be enhanced compared with the first manufacturing method.

A particle mask including the plurality of first particles SL, which have the particle size (B), are placed over the formed second circular protrusions 13, and etching is performed. The formation of the second circular protrusions 13 is accomplished by using the second particles SS, which have the particle size (A), as a mask. The period of the second circular protrusions 13 is the pitch (A). The relationship between the first particle size (B) of the first particles SL and the second particle size (A) of the second particles SS satisfies the following relationship.

$$0 \leq (B-A) < 1.2 \times A$$

When (B−A) is less than 1.2×A, two wavelengths that are extracted can be in the range of the entire visible light wavelength region. Thus, emission wavelengths necessary for display devices and illumination devices are obtained. Also, when (B−A) is greater than or equal to 0, light energy of the same wavelength or of wavelengths in a relatively close wavelength region can be extracted. Thus, light utilization efficiency for a particular single wavelength region is increased. It is more preferable that the relationship between the first particle size (B) of the first particles SL and the second particle size (A) of the second particles SS be $0 \leq (B-A) < 1.0 \times A$.

First Particle Etching Step

Figure 23:
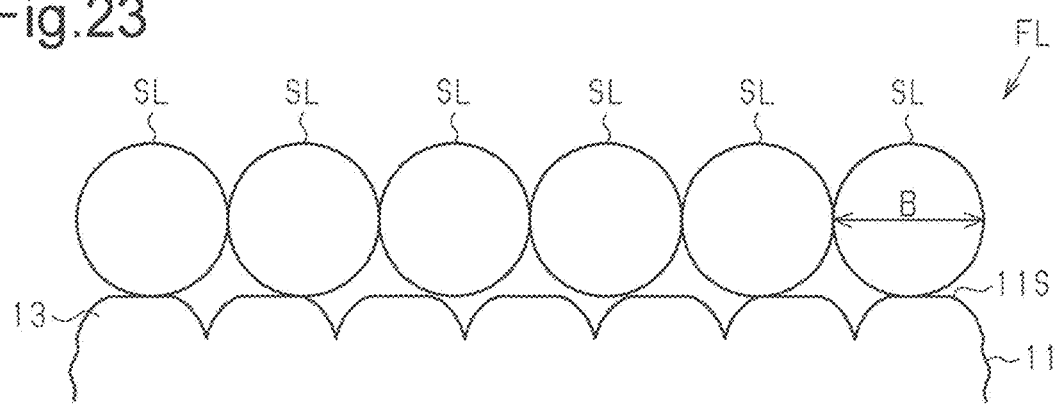
FIG. 23 is a diagram schematically illustrating a step in a different method for manufacturing a substrate and illustrates a state of the substrate after transfer of the particle monolayer to the processing surface. The particle monolayer is used in the first particle etching step.

As illustrated in FIG. 23, the particle monolayer FL, which includes a monolayer of the first particles SL, is formed on the processing surface 11S. The processing surface 11S includes the second circular protrusions 13 formed thereon by the second particle etching step. In plan view of the processing surface 11S, the particle monolayer FL has a structure in which the first particles SL are hexagonally close-packed.

Figure 24:
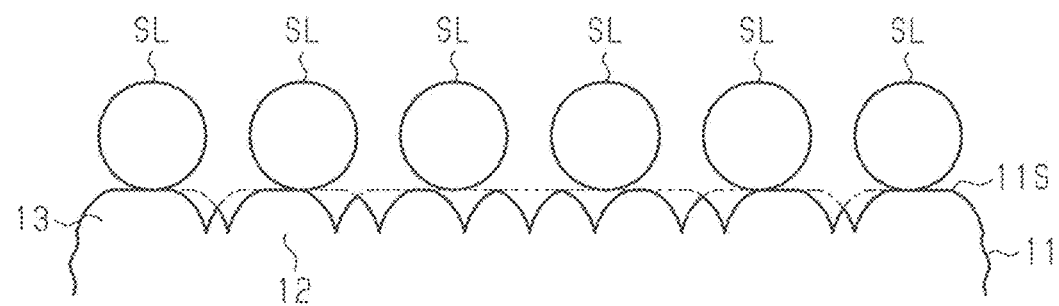
FIG. 24 is a diagram schematically illustrating a step in the different method for manufacturing a substrate and illustrates the shapes of the particle monolayer and the substrate during etching of the substrate in the first particle etching step.

As illustrated in FIG. 24, in the first particle etching step, first, the processing surface 11S is etched by using the first particles SL as a mask. As the first particles SL are consumed (particle size shrinks), regions between adjacent first particles SL become regions not protected by the particles, and such regions of the processing surface 11S also begin to be etched.

The etching of the processing surface 11S is stopped before the first particles SL, which are included in the particle monolayer FL, disappear as a result of etching. Thereafter, the first particles SL are removed from the processing surface 11S. The plurality of protrusions 14 are formed in this manner. The apices of the protrusions 14 are flat surfaces that lie in the same plane.

Figure 25A:
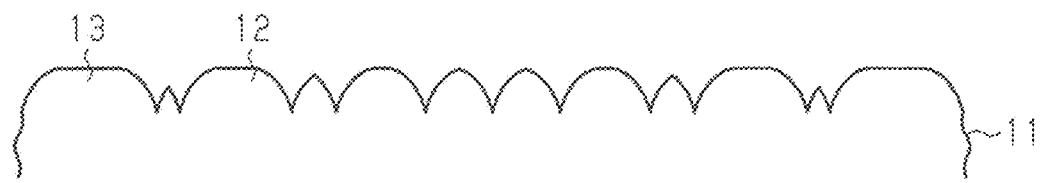
FIG. 25A is an illustration of the shape of the substrate after being etched in the first particle etching step.
Figure 25B:
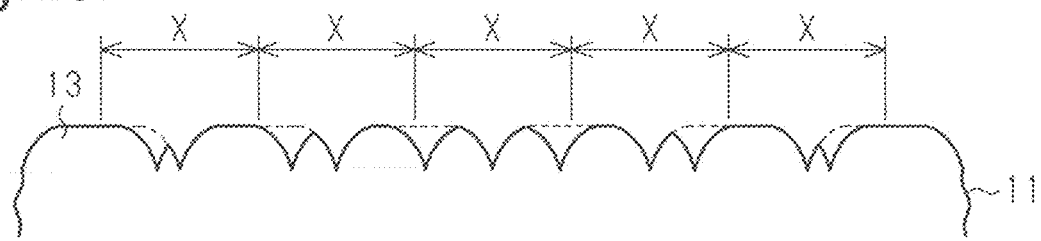
FIG. 25B is an illustration of a first pitch X.
Figure 25C:
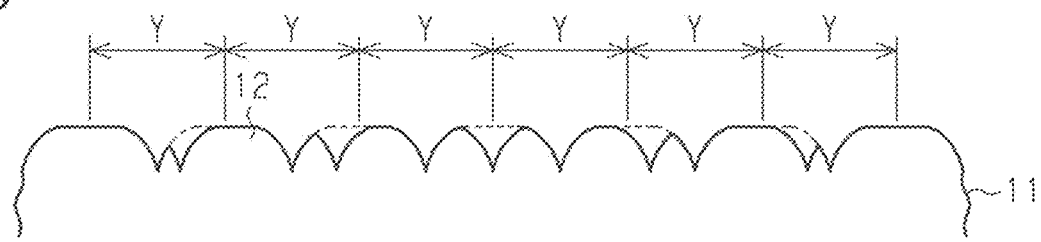
FIG. 25C is an illustration of a second pitch Y.

FIG. 25A is a schematic illustration of a recessing and protruding structure produced by the manufacturing method described above. The structure in FIG. 25A is a structure such that the first pitch X illustrated in FIG. 25B and the second pitch Y illustrated in FIG. 25C overlap each other. The power spectrum of the height distribution obtained by two-dimensional Fourier transform of the surface topography of the structure of FIG. 25A indicates the periodicities corresponding to both the pattern of the first particles SL arrangement and the pattern of the second particles SS arrangement.

The first particle layer formation step in the first manufacturing method and the second manufacturing method may be replaced with a different method for forming a periodic recessing and protruding structure. Examples of different methods for forming a periodic recessing and protruding structure are as follows. In one method, a periodic recessing and protruding structure may be formed by producing a mask pattern of a photoresist material on a substrate and etching the substrate through the mask. In another method, a periodic recessing and protruding structure may be formed by machining the surface of a substrate. In another method, a periodic recessing and protruding structure may be formed by nanoimprinting. In another method, a substrate having a periodic recessing and protruding structure on the surface may be produced by injection molding.

The substrate 11 manufactured by the first manufacturing method or the second manufacturing method as described above can be used as a substrate of a semiconductor light emitting element of an organic light emitting diode or as a substrate of an organic thin film solar cell.

Modified Example of Recessing and Protruding Structure Manufacturing Method

The manufacturing methods described above may be appropriately modified in the following manner and implemented.

The depth of the groove formed by etching in the first particle etching step in the first manufacturing method and the depth of the groove formed by etching in the second particle etching step in the second manufacturing method may be the same or may be different from each other. For example, the depth of the grooves may be set in accordance with the extraction wavelength. For example, for an organic light emitting diode, when it is desired to enhance extraction of the blue component (B) particularly, an adjustment is made to configure the grooves corresponding to the blue component (B) to have an optimal depth for conversion to propagating surface plasmons and light propagating through space. The optimal depth for conversion to propagating surface plasmons and light propagating through space ranges from 20 to 100 nm, preferably from 30 to 80 nm, and more preferably from 40 to 60 nm. In a case where the depth is above the range or below the range, the efficiency of conversion to propagating surface plasmons and light propagating through space decreases.

Methods Using Master Mold for Manufacturing Substrate and for Manufacturing Organic Light Emitting Diode and Organic Thin Film Solar Cell The substrate 11 manufactured by the first manufacturing method or the second manufacturing method may be used as a master mold. In a third step, the structure on the surface of the master mold may be replicated to, for example, a mold or a stamper, and the recessing and protruding pattern of the mold or the stamper may be replicated to a substrate that is to serve as the substrate 11.

In still another embodiment, recesses and protrusions may be formed on one interface of the cathode conductive layer of an organic light emitting diode, the one interface being the interface closer to the light emitting layer. This may be accomplished by forming recesses and protrusions on one of the interfaces of the organic semiconductor layer by nanoimprinting using the substrate 11 as a master mold. It is also possible that, in an organic thin film solar cell, recesses and protrusions may be formed on one interface of the cathode conductive layer, the one interface being the interface closer to the organic semiconductor layer. This may be accomplished by forming recesses and protrusions on one of the interfaces of the organic semiconductor layer by nanoimprinting using the substrate 11 as a master mold. The recessing and protruding shape provided to the interface may be a shape reverse to that of the master mold or may be the same shape as that of the master mold. When transfer from the master mold is performed an even number of times, the shape is the same recessing and protruding shape as that of the master mold. When transfer from the master mold is performed an odd number of times, the shape is a recessing and protruding shape reverse to that of the master mold.

The transfer of the structure on the surface of the master mold may be carried out by a known method, such as a nanoimprinting method, a hot-press method, an injection molding method, or a UV embossing method. As the number of times of transfer increases, the microscopic recessing and protruding shape becomes blunt. Thus, it is preferable that the number of times of transfer from the master mold not be greater than 5 times for practical purposes. In such methods, the substrate 11 is used as a master mold to transfer the surface shape of the master mold or a reverse shape reverse to the surface shape of the master mold to a substrate 11 of an organic light emitting diode or the organic semiconductor layer thereof.

Organic Light Emitting Diode

Figure 26:
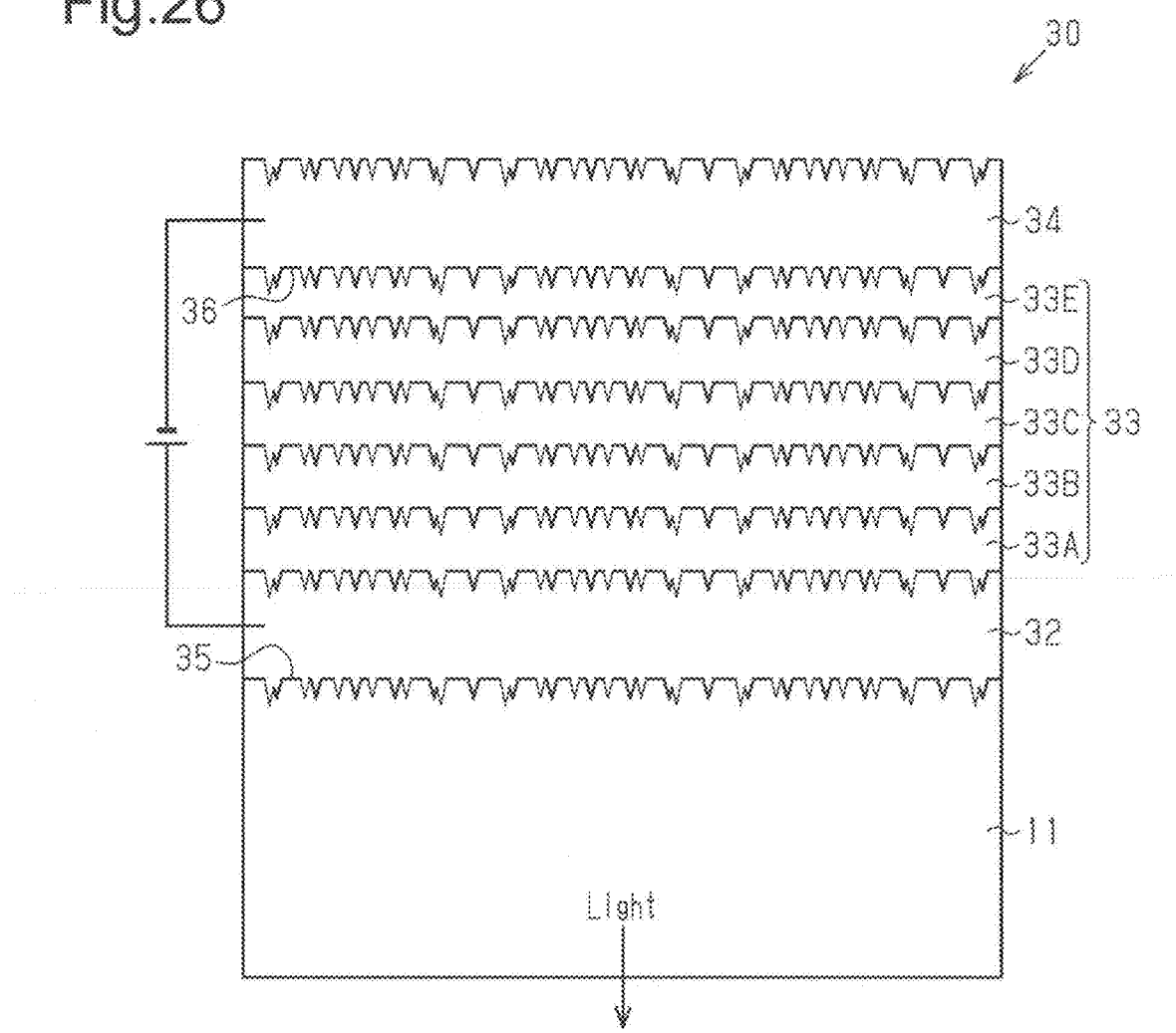
FIG. 26 is a cross-sectional view of an organic light emitting diode according to an embodiment, illustrating a configuration, in cross section, of the organic light emitting diode.

An embodiment of the organic light emitting diode will be described with reference to FIG. 26. FIG. 26 illustrates an example of a bottom-emission type organic light emitting diode. The organic light emitting diode includes an anode conductive layer 32, an organic semiconductor layer 33, and a cathode conductive layer 34, which are sequentially stacked over the substrate 11. The substrate 11 includes a transparent material. The anode conductive layer 32 includes a transparent conductive material. The cathode conductive layer 34 includes Ag.

The substrate 11 of the organic light emitting element is formed by using, as a master mold, a substrate including a recessing and protruding structure on the surface. The recessing and protruding structure is replicated to the surface of the substrate 11 of the organic light emitting element. Thin layers, such as the anode conductive layer 32 and the organic semiconductor layer 33, are stacked over the substrate. The organic light emitting element is manufactured such that the recessing and protruding structure is reproduced at least on the interface between the organic semiconductor layer 33 and the cathode conductive layer 34.

It is also possible that the organic light emitting element may be manufactured in the following manner. A substrate including a recessing and protruding structure on the surface is used as a master mold. The recessing and protruding structure is replicated to the surface of the organic semiconductor layer 33, which is stacked over the substrate, and the cathode conductive layer 34 is stacked over the organic semiconductor layer 33, so that the recessing and protruding structure can be reproduced on the interface between the organic semiconductor layer 33 and the cathode conductive layer 34.

For transfer of a recessing and protruding structure of a substrate including such a recessing and protruding structure, it is possible to use a substrate including the recessing and protruding structure having recesses and protrusions formed by etching or to use a replica, of a master mold, produced by performing transfer one or more times.

The method for transfer from a master mold one or more times may be the following, for example. In one method, a master mold or a replica of a master mold may be filled with a liquid resin, and after the resin is cured, the master mold or the replica of a master mold may be removed. In another method (nickel electroforming), a metal coating process may be performed on a master mold or a replica of a master mold, and thereafter the master mold or the replica of a master mold may be removed. In an embodiment of the present invention, the shape having a replicated recessing and protruding structure includes a shape including a plurality of protrusions, and also, a shape reverse to a shape including a plurality of protrusions, that is, a shape including a plurality of recesses.

The method for forming the layers to be stacked over the substrate may be as follows, for example. The anode conductive layer may be formed by a sputtering method. The organic semiconductor layer may be formed by a vapor deposition method or a coating method (spin coating method or slit coating method). The cathode conductive layer may be formed by a vapor deposition method.

The organic semiconductor layer 33 includes a hole injection layer 33A, a hole transport layer 33B, an organic light emitting layer 33C, which includes an organic light emitting material, an electron transport layer 33D, and an electron injection layer 33E, which are sequentially stacked, with the hole injection layer 33A being closest to the anode conductive layer 32. These layers each may have one function or may have two or more functions. For example, one layer may serve as the electron transport layer 33D and also as the light emitting layer 33C. An electron blocking layer and a hole blocking layer, for example, may be incorporated in the element configuration as necessary.

In the case of organic light emitting diodes for emitting white light, the light emitting layer 33C includes a light emitting layer including an organic light emitting material that emits light of a first wavelength, a light emitting layer including an organic light emitting material that emits light of a second wavelength, and a light emitting layer including an organic light emitting material that emits light of a third wavelength. These layers are stacked together. The balance between the materials is adjusted so that the chromaticity coordinates of the emission colors can be approximately (x, y)=(0.33, 0.33) as a result of superimposing the three emission spectra. When a voltage is applied across the electrodes of the element produced as described above, the light emitting layers each emit light so that white light can be emitted from the light emitting layer 33C.

A recessing and protruding structure 35 is provided on one surface of the substrate 11, the one surface being the surface over which the anode conductive layer 32 is to be stacked. The recessing and protruding structure 35 is formed with the plurality of protrusions 14, which constitute the arrangement of the first circular protrusions 12 having the first pitch X and the arrangement of the second circular protrusions 13 having the second pitch Y. The anode conductive layer 32, the organic semiconductor layer 33 (hole injection layer 33A, the hole transport layer 33B, the light emitting layer 33C, the electron transport layer 33D, and the electron injection layer 33E) are sequentially stacked over this structure. As a result, the same structure as the structure on the surface of the substrate 11 is formed on one surface of each of the layers, the one surface being the surface closer to the cathode conductive layer 34. Thus, when the cathode conductive layer 34 is finally stacked over the organic semiconductor layer 33, a structure reverse to the structure on the surface of the substrate 11, that is, recesses 36, are formed on one surface of the cathode conductive layer 34, the one surface being the surface closer to the organic semiconductor layer 33. The recesses 36 include a plurality of periodic components. The presence of the structure including a plurality of periodic components (grating overlap structure) enables conversion of surface plasmons on the one surface of the cathode conductive layer 34 to propagating light, the one surface being the surface closer to the organic semiconductor layer 33.

Overlap of Periodic Patterns Having Same Grating Pitch

A first mask having a periodic pattern is positioned over the surface of the substrate and the substrate is etched through the first mask. Thus, the plurality of protrusions are formed. Next, a second mask is positioned over the surface of the substrate, which includes the plurality of protrusions formed thereon. The second mask has the same grating structure and the same grating pitch as those of the periodic pattern of the first mask, and has a grating axis direction and grating points. At least one of the grating axis direction and the grating points is different from the grating axis direction or the grating points of the periodic pattern of the first mask. The substrate is etched through the second mask. With this process, by using two masks having the same grating pitch, two gratings having the same grating pitch can be formed overlapping on the same plane.

The organic light emitting element is manufactured as described above. In the organic light emitting element, the substrate includes the recessing and protruding structure formed with overlapping two identical grating pitches. The cathode conductive layer, the organic semiconductor layer, and the anode conductive layer are stacked over the substrate in such a manner that the recessing and protruding structure is reproduced at least on the interface between the cathode conductive layer and the organic semiconductor layer. The thus produced grating overlap structure including overlapping identical pitches is useful to improve the light extraction efficiency of one wavelength from an organic light emitting diode of a single emission wavelength (monochrome element). That is, regarding monochrome elements, in order to further increase the light extraction efficiency of a wavelength λmax, which is a wavelength that achieves a maximum emission output value, the pitch of the overlapping gratings may be configured to be suitable for extraction of light of λmax. As a result, the light extraction efficiency is further increased compared with the case where a single grating is incorporated to extract one wavelength.

Operation of Organic Light Emitting Diode

When light emitting molecules emit light in the light emitting layer 33C, near-field light is generated in an immediate vicinity. The distance between the light emitting layer 33C and the cathode conductive layer 34 is very small, and thus the near-field light is converted to energy of propagating surface plasmons on the surface of the cathode conductive layer 34. The propagating surface plasmon on the surface of a metal is a compressional wave of free electrons generated by incident electromagnetic waves (e.g., near-field light) and involves the surface electromagnetic field. In the case of surface plasmons present on a flat surface of a metal, the dispersion curve of the surface plasmons and the dispersion straight line of light (light propagating through space) do not cross each other, and thus the energy of the surface plasmons cannot be extracted as light. On the other hand, when the surface of a metal has a recessing and protruding structure by which surface plasmons can be diffracted, the dispersion curve of surface plasmons diffracted by the recessing and protruding structure crosses the dispersion curve straight line of light propagating through space. Thus, the energy of the surface plasmons can be extracted as radiant light. In an embodiment of the present invention, in the case where a recessing and protruding structure having two periodicities is incorporated in an overlapping manner, two types of wavelengths of surface plasmons can be extracted. In an embodiment of the present invention, in the case where a recessing and protruding structure having one period is incorporated in an overlapping manner, while one type of wavelength of surface plasmons can be extracted, the intensity, that is, the output is high compared with the case where a recessing and protruding structure having one period is singly incorporated.

Thus, in an embodiment of the present invention, the plurality of two-dimensional grating structures are provided via the protrusions 14 and this enables extraction of light that would be lost to surface plasmons in a typical organic light emitting diode. The extracted energy is radiated as radiant light from a surface of a cathode conductive layer 36. This radiant light is characterized by high directionality. When the emission direction of the radiant light is configured to be within the light cone of a bottom-emission type organic light emitting diode, the radiant light passes through the organic semiconductor layer 33, the anode conductive layer 32, and the substrate 11 and travels toward the light extraction face. As a result, high intensity light is emitted from the light extraction face and thus the light extraction efficiency is improved. In an embodiment of the present invention, the cathode conductive layer 36 includes a grating structure that is in accordance with the grating structure of the substrate 11. Thus, in particular, light of two wavelengths corresponding to two emission peaks can be extracted efficiently.

Modified Example of Element Configuration for Organic Light Emitting Diode

The organic light emitting diode described above may be appropriately modified in the following manner and implemented.

The light extraction method for the organic light emitting diode may be the bottom-emission type described above or the top-emission type. In the case where the top-emission type is employed, the top face of the stack of layers may be the cathode conductive layer or the anode conductive layer. In the case where the bottom-emission type is employed, the substrate is transparent or translucent. In the case where the top-emission type is employed, the substrate is not limited to a transparent substrate.

For each of the light extraction methods described above, a typical stack configuration will be described below.

(1) Bottom-Emission Method (Light Extraction Face is Transparent Substrate):

Transparent substrate (including a recessing and protruding structure on the anode conductive layer-side surface)-anode conductive layer (transparent electrode)-organic semiconductor layer (hole injection layer-hole transport layer-light emitting layer-electron transport layer-electron injection layer)-cathode conductive layer (metal electrode).

(2) Top-Emission Method (Light Extraction Face is Cathode Conductive Layer):

Substrate (including a recessing and protruding structure on the reflective layer-side surface)-reflective layer-anode conductive layer (transparent electrode)-organic semiconductor layer (hole injection layer-hole transport layer-light emitting layer-electron transport layer-electron injection layer)-cathode conductive layer (semi-transparent metal electrode)-auxiliary electrode (transparent electrode).

(3) Top-Emission Method (Light Extraction Face is Anode Conductive Layer):

Substrate (including a recessing and protruding structure on the cathode conductive layer-side surface)-cathode conductive layer (metal electrode)-organic semiconductor layer (electron injection layer-electron transport layer-light emitting layer-hole transport layer-hole injection layer)-anode conductive layer (transparent electrode).

In all the cases, the microscopic recessing and protruding structure of the substrate 11 is formed on one interface of the cathode conductive layer, the one interface being the interface closer to the organic semiconductor layer. As a result, surface plasmons formed on the conductive layer can be extracted as radiant light.

In the above example, a multi-layer white element is described which includes a stack of light emitting layers corresponding to three wavelengths. It is also possible that the element configuration of the organic light emitting diode may be monochrome elements, the tandem type, or the multi-photo emission type. For the tandem type or the multi-photo emission type, a method in which a plurality of monochrome light emitting layers are stacked via an intermediate layer is employed. The intermediate layer includes a material capable of generating electric charge. It is also possible that the light emitting layers of different colors may be arranged in the directions in which the anode conductive layer 32 and the cathode conductive layer 34 extend.

Modified Example of Method for Manufacturing Organic Light Emitting Element

A first mask having a periodic pattern is positioned over the surface of the substrate and the substrate is etched through the first mask. Thus, the plurality of protrusions are formed. Next, a second mask is positioned over the surface of the substrate, which includes the plurality of protrusions formed thereon. The second mask has the same grating structure as that of the periodic pattern of the first mask and has a grating axis direction and a grating pitch. At least one of the grating axis direction and the grating pitch is different from that of the periodic pattern of the first mask. The substrate is etched through the second mask. Instead, another second mask may be positioned over the surface of the grating structure substrate, which includes the plurality of protrusions formed thereon. The second mask has the same grating pitch as that of the periodic pattern of the first mask or a different grating pitch. The substrate may be etched through the second mask.

By the method described above, the organic light emitting element including the recessing and protruding structure, which is a feature according to an embodiment of the present invention, on the substrate is manufactured. The cathode layer, the organic light emitting layer, and the anode layer are stacked over the substrate and the recessing and protruding structure is reproduced at least on the interface between the cathode layer and the organic light emitting layer. The order in which the cathode layer and the anode layer are stacked may be reversed.

Organic Thin Film Solar Cell

Figure 27:
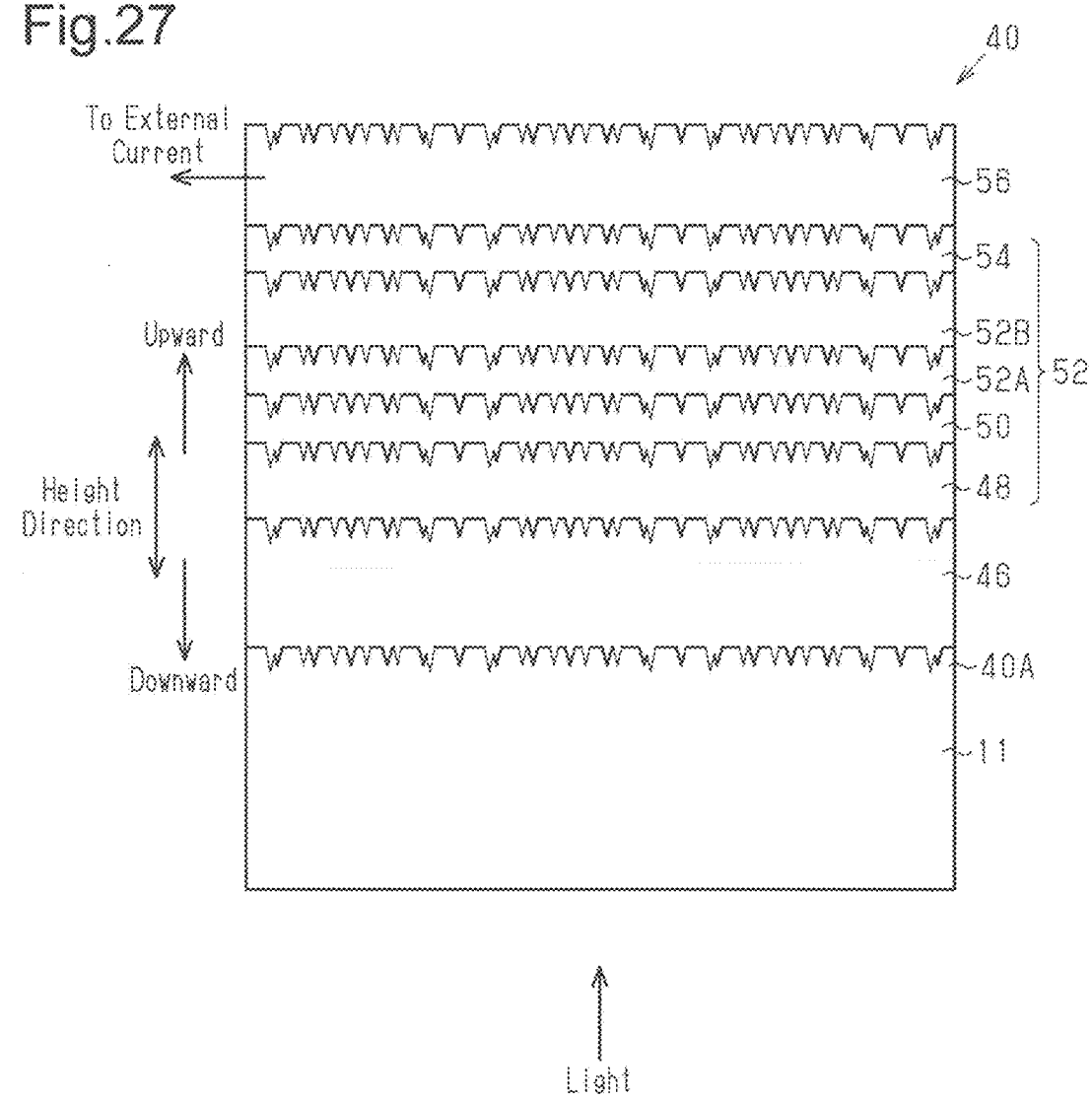
FIG. 27 is a cross-sectional view of an organic thin film solar cell according to an embodiment, illustrating a configuration, in cross section, of the organic thin film solar cell.

An embodiment of the organic thin film solar cell, which is a specific example of an organic photoelectric conversion element, will be described with reference to FIG. 27. An organic thin film solar cell 40 includes the substrate 11 and a grating structure 40A. The substrate 11 includes a transparent material and allows transmission of sunlight. The grating structure 40A is formed on the substrate 11. The grating structure 40A includes the plurality of protrusions 14 including the two periodic components, the first pitch X and the second pitch Y. An anode conductive layer 46, a hole extraction layer 48, an electron blocking layer 50, an electron donating organic semiconductor layer 52A (p-layer) (hereinafter also referred to as electron donor layer 52A), an electron accepting organic semiconductor layer 52B (n-layer) (hereinafter also referred to as electron acceptor layer 52B), which is formed over the electron donor layer 52A, an electron extraction layer 54, and a cathode conductive layer 56 are sequentially stacked over the grating structure 40A. An i-layer (intrinsic semiconductor layer) may be provided between the p-layer and the n-layer. The organic semiconductor layer 52 includes the hole extraction layer 48, the electron extraction layer 54, and the layers in between.

As described above, the grating structure 40A is formed on the substrate 11, and thus the microscopic recessing and protruding structure is also formed on the surface of the anode conductive layer 46, which is stacked over the substrate 11. Further, the shape of such a microscopic recessing and protruding structure is also reflected to the interface between the electron extraction layer 54 and the cathode conductive layer 56. Thus, the microscopic recessing and protruding structure 40A on the surface of the substrate 11 is formed on the surfaces of the anode conductive layer 46, the hole extraction layer 48, the electron blocking layer 50, the electron donor layer 52A, the electron acceptor layer 52B, the electron extraction layer 54, and the cathode conductive layer 56, which are stacked over the substrate 11. Since the thicknesses of the layers are very small, ranging from several tens to a hundred and several tens of nanometers, the recessing and protruding structure is reflected to each layer without being filled even when the layers are stacked, so that the recessing and protruding structure can be duplicated. As a result, in the organic thin film solar cell 40, the grating structure 40A is also replicated to the interface between the electron extraction layer 54 and the cathode conductive layer 56.

Operation of Organic Thin Film Solar Cell

In the organic thin film solar cell 40, produced as described above, sunlight entering from the substrate 11 side passes through the anode and other layers, and thereafter reaches the organic semiconductor layer 52. The organic semiconductor layer 52 includes a pn interface where the electron donor layer 52A and the electron acceptor layer 52B are in contact with each other. When light energy is applied to the pn interface of the organic semiconductor layer 52, the light is absorbed by the electron donor molecules in the organic semiconductor layer 52 to generate excitons. Excitons undergo charge separation at the interface between the electron donor and the electron acceptor, and the electrons are replicated to the electron acceptor. The electrons eventually flow from the electron acceptor to the cathode conductive layer 56. On the other hand, the holes flow to the anode conductive layer 46. Some portion of the light passes through the electron donor layer 52A and the electron acceptor layer 52B and reaches the cathode conductive layer 56. The light is reflected by the cathode conductive layer 56 and again contributes to charge separation at the pn interface between the electron donor layer 52A and the electron acceptor layer 52B. Furthermore, some portion of the light is emitted outside the device of the organic thin film solar cell 40.

In general, one problem with organic thin film solar cells is that light passes through the organic semiconductor layer only in a transient pass, which results in insufficient light absorption.

On the other hand, with the organic thin film solar cell 40 according to an embodiment of the present invention, when sunlight (propagating light) enters the device, some portion of the propagating light is diffracted by the recessing and protruding structure on the interface between the electron extraction layer 54 and the cathode conductive layer 56 and converted into surface plasmons propagating on the cathode conductive layer 56. While the surface plasmons, which are converted in the cathode conductive layer 56, are propagating on the surface of the cathode, the electromagnetic field due to the surface plasmons envelops the pn junction interface of the organic semiconductor layer 52 described above. Thus, efficient charge separation occurs by the organic semiconductor layer 52. As a result, the organic thin film solar cell 40 has a high photoelectric energy conversion efficiency compared with organic thin film solar cells in the related art.

Possible methods for configuring the first pitch X and the second pitch Y, which are included in the microscopic recessing and protruding structure 40A on the surface of the substrate 11, include the following two methods. In one method, the grating structure is configured such that the first pitch X and the second pitch Y correspond to the absorbance peak of the organic semiconductor layer 52 to increase the photoelectric conversion efficiency. In the other method, wavelengths in the solar spectrum to be used for photoelectric conversion are selected in advance, and grating structures of the first pitch X and the second pitch Y are configured. Either of the above methods enables improvement in the photoelectric conversion efficiency of the organic thin film solar cell 40 of the of the present invention.

Consequently, the recessing and protruding structure on the interface between the electron extraction layer 54 and the cathode conductive layer 56 diffracts light of wavelengths corresponding to the first pitch X and the second pitch Y to enable conversion to surface plasmons propagating on the cathode conductive layer 56. Thus, the conversion efficiency for light of two wavelengths corresponding to the first pitch X and the second pitch Y is increased.

The substrate 11 of the organic thin film solar cell according to an embodiment of the present invention may be formed by using, as a master mold, a substrate including a recessing and protruding structure on the surface. The recessing and protruding structure of the substrate is replicated to the surface of the substrate 11 of the organic thin film solar cell. The anode conductive layer 46, the hole extraction layer 48, the electron blocking layer 50, the electron donor layer 52A, the electron acceptor layer 52B, the electron extraction layer 54, and the cathode conductive layer 56 are stacked over the substrate. The organic thin film solar cell is manufactured such that the recessing and protruding structure is reproduced at least on the interface between the electron extraction layer 54 and the cathode conductive layer 56. A hole blocking layer may be appropriately incorporated in the element configuration.

It is also possible that the organic thin film solar cell may be manufactured in the following manner. A substrate including a recessing and protruding structure on the surface is used as a master mold. The recessing and protruding structure is replicated to the surface of the electron extraction layer 54, which is stacked over the substrate, and the cathode conductive layer 56 is stacked over the electron extraction layer 54. Thus, the recessing and protruding structure is reproduced on the interface between the electron extraction layer 54 and the cathode conductive layer 56.

Furthermore, the organic thin film solar cell may be manufactured in the following manner. After any of the layers of the organic thin film solar cell is formed over a flat substrate, a substrate including a recessing and protruding structure on the surface is used as a master mold to transfer the recessing and protruding structure to the surface of the any of the layers, and upper layers are stacked thereover. Thus, the recessing and protruding structure is reproduced on at least one interface of the cathode conductive layer 56, the one interface being the interface closer to the electron extraction layer 54.

Modified Example of Organic Thin Film Solar Cell

The organic thin film solar cell described above may be appropriately modified in the following manner and implemented.

The number of the grating structures, which are formed from the protrusions, is not limited to two. The protrusions have predetermined pitches that are different from each other. For example, when the organic semiconductor layer 52 has three or more absorbance peaks, or three or more wavelengths in the solar spectrum are desired to be utilized for power generation, the number of the grating structures may be three or more.

The grating structure 40A, the anode conductive layer 46, the organic semiconductor layer 52, and the cathode conductive layer 56 are stacked in this order over the substrate 11. The stacking order, however, may not be limited to this order and may be reversed. It is sufficient that the grating structure 40A be reflected to one interface of the cathode conductive layer 56, the one interface being the interface closer to the organic semiconductor layer 52.

The organic thin film solar cell 40 may be a multi-layer structure such as a tandem type structure. The organic thin film solar cell 40, when it is a multi-layer structure, may be produced in such a manner that the recessing and protruding structure is formed on one interface of the cathode conductive layer, the one interface being the interface closest to the organic semiconductor layer. This results in increased photoelectric conversion efficiency.

The light that enters the organic thin film solar cell is not limited to sunlight. The type of the light source may be appropriately selected. A portion or the whole of the light may be room light, such as light of a fluorescent lamp or of LEDs, for example.

EXAMPLES

Examples of embodiments of the present invention will be described below. The examples do not necessarily limit the structure, configuration, or method of the associated organic light emitting diode provided that the concept of the present invention is used.

Example 1

First Particle Layer Formation Step

A 10.0 mass % aqueous dispersion (dispersion) of a spherical colloidal silica having an average particle size of 361.1 nm and a coefficient of variation of the particle size of 6.4% was prepared. The average particle size and the coefficient of variation of the particle size were determined from the peak obtained by fitting the particle size distribution to a Gaussian curve. The particle distribution was determined by a particle dynamic light scattering method using a Zetasizer Nano-ZS, available from Malvern Instruments Ltd.

Next, the dispersion was filtered through a membrane filter having a pore size of 0.8 μmφ. Then, a phenyltriethoxysilane hydrolysate aqueous solution having a concentration of 1.0 mass % was added to the filtrate. The mixture was reacted at approximately 55° C. for 2.5 hours. The dispersion and the hydrolysate aqueous solution were mixed such that the mass of the phenyltriethoxysilane was 0.02 times the mass of the colloidal silica particles.

Following completion of the reaction, methyl isobutyl ketone of a volume 3.5 times the volume of the dispersion was added to the dispersion and stirred thoroughly, and hydrophobic colloidal silica in the oil phase was extracted.

The obtained hydrophobic colloidal silica dispersion, having a concentration of approximately 1 mass %, was dripped at a drip rate of 0.25 mL/second onto the liquid surface (water was used as the lower-layer water and the water temperature was 25.5° C.) in a water tank (LB trough apparatus). The water tank was fitted with a surface pressure sensor for measuring the surface pressure of the particle monolayer and a moveable barrier for compressing the particle monolayer in a direction along the liquid surface. A quartz substrate (30 mm×30 mm×1.0 mm, both sides mirror polished) for use as a transparent substrate for an organic light emitting diode was immersed in advance in a substantially vertical direction in the lower-layer water in the water tank.

Thereafter, ultrasonic waves (having a power of 100 W and a frequency of 1.5 MHz) were applied for 10 minutes from within the lower-layer water toward the water surface to promote two-dimensional close packing of the particles while volatilizing the methyl isobutyl ketone, which is the solvent of the dispersion, to form a particle monolayer.

Subsequently, this particle monolayer was compressed by the moveable barrier until a diffusion pressure of 22 to 30 $mNm^{-1}$ was reached, and the quartz substrate was then pulled at a rate of 4.5 mm/minute, thereby transferring the particle monolayer from the water surface to one surface of the substrate.

Subsequently, a hydrolysate solution of 0.15 mass % monomethyltrimethoxysilane, which was used as a binder, was allowed to permeate onto the quartz substrate including the particle monolayer formed thereon, and an excess of the hydrolysate solution was then removed by spin coater (3,000 rpm) processing for one minute. Thereafter, heating was performed at 100° C. for 10 minutes to react the binder to fix the particles to the substrate. Thus, a quartz substrate including a colloidal silica particle monolayer was obtained.

First Etching Step

Subsequently, the obtained quartz substrate including the particle monolayer was subjected to dry etching using $CHF_3$ gas. The dry etching conditions included an antenna power of 1500 W, a bias power of from 50 to 300 W (13.56 MHz), a gas flow rate of from 50 to 200 sccm, and a pressure of from 1.0 to 3.0 Pa.

Second Particle Layer Formation Step

A monolayer film of spherical colloidal silica was placed on the recessing and protruding structure of the quartz substrate including the recessing and protruding structure, obtained in the first etching step. The spherical colloidal silica had an average particle size of 468.5 nm and the coefficient of variation of the particle size was 4.1%. An operation similar to that of the first particle layer formation step except for differences in the particle size and the coefficient of variation thereof was performed.

Second Etching Step

Subsequently, the obtained quartz substrate including the particle monolayer was subjected to dry etching using $CHF_3$ gas. The dry etching conditions included an antenna power of 1500 W, a bias power of from 50 to 300 W (13.56 MHz), a gas flow rate of from 50 to 200 sccm, and a pressure of from 1.0 to 3.0 Pa.

Evaluation of Microscopic Structure

Figure 28A:
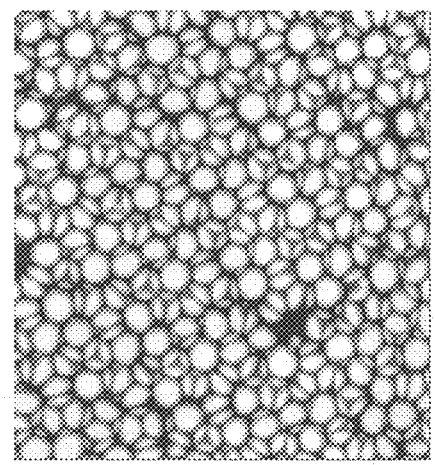
FIG. 28A is an AFM image of the surface of a substrate in Example 1.

After dry etching, the surface of the obtained substrate was observed with an atomic force microscope (AFM), and a microscopic overlap structure was identified as shown in FIG. 28A. The modal height Ha of the protrusions in the microscopic overlap structure was determined in the manner described in paragraph 0116. Randomly selected five regions in total, each measuring 5 μm×5 μm, in the AFM image obtained from the surface of the microscopic overlap structure were used. Further, the average of the results was determined, and the average was 132.0 nm.

Figure 28B:
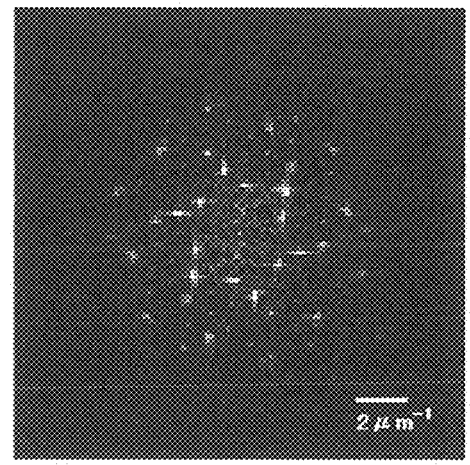
FIG. 28B is a two-dimensional Fourier transform image of the AFM image in FIG. 28A.

The AFM image was subjected to two-dimensional Fourier transform. The obtained two-dimensional Fourier transform image is shown in FIG. 28B. The Fourier transform image shows power spectra regarding the spatial frequencies of the two periodic components produced on the microscopic overlap structure. Twelve spots of high intensities derived from the fundamental wave, which is closest to the origin, were extracted, and the reciprocals of the distances between the bright spots and the origin were determined. Thus, the pitches of the two periodic components were obtained. Specifically, as shown in Table 1, the pitch X was determined to be 366.9 nm from six spots of high intensities located farther from the origin, and the pitch Y was determined to be 477.5 nm from six spots of high intensities located closer to the origin.

Production of Organic Light Emitting Diode

A film of IZO that was to serve as the anode conductive layer was formed on the microscopic structure-side surface of the produced grating overlap structure substrate, to a thickness of 120 nm by a sputtering method. Next, a film of 2-TNATA, which was used as a hole injection material, was formed to a thickness of 30 nm by a vapor deposition method. Thus, the hole injection layer was formed. Next, a film of α-NPD, which was used as a hole transport material, was formed to a thickness of 70 nm by a vapor deposition method. Thus, the hole transport layer was formed. Next, a multilayer film of a 3-layer structure that was to serve as an electron transfer and light-emitting layer was formed by the procedure described below. Specifically, a film of a red light-emitting material containing Alq doped with a 1.0% concentration of coumarin C545T was formed by a vapor deposition method to a thickness of 5 nm on the hole transport layer, a film of a green light-emitting material containing a conductive material (PH1) doped with a 5.0% concentration of Ir(piq)$_3$ was then formed by a vapor deposition method to a thickness of 20 nm, and a film of a blue light-emitting material containing DPVBi doped with a 5.0% concentration of BcZVBi was then formed by a vapor deposition method to a thickness of 30 nm. Next, a film of Alq$_3$, which was used as an electron transport material, was formed by a vapor deposition method to a thickness of 20 nm. Thus, the electron transport layer was formed. Further, a film of LiF that was to serve as the electron injection layer was formed to a thickness of 0.6 nm by a vapor deposition method. Finally, a film of aluminum was formed to a thickness of 150 nm by a vapor deposition method to form the cathode conductive layer. Thus, a bottom emission-type white organic light emitting diode element was produced. By using a shadow mask to perform vapor deposition, a light emission area measuring 2×2 mm was produced.

Example 2

Figure 29A:
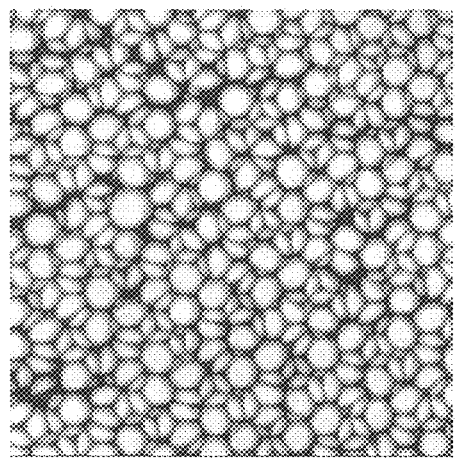
FIG. 29A is an AFM image of the surface of a substrate in Example 2.
Figure 29B:
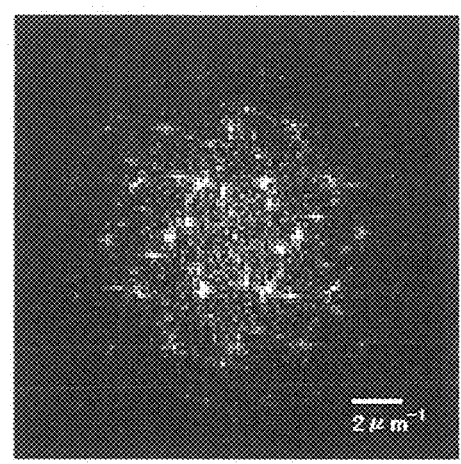
FIG. 29B is a two-dimensional Fourier transform image of the AFM image in FIG. 29A.

Another white organic light emitting diode element was produced by producing a microscopic overlap structure in the same manner as in Example 1 except for the following differences. The spherical colloidal silica and the etching conditions to be used in the first etching step were changed to the spherical colloidal silica and the etching conditions that were used in the second etching step of Example 1. The spherical colloidal silica and the etching conditions to be used in the second etching step were changed to the spherical colloidal silica and the etching conditions that were used in the first etching step of Example 1. FIG. 29A is an AFM image of the surface of the substrate and FIG. 29B is a two-dimensional Fourier transform image of the AFM image in FIG. 29A, in Example 2. The pitch X and the pitch Y obtained from the two-dimensional Fourier transform image and the height in the AFM image are shown in Table 1.

Example 3

Figure 30A:
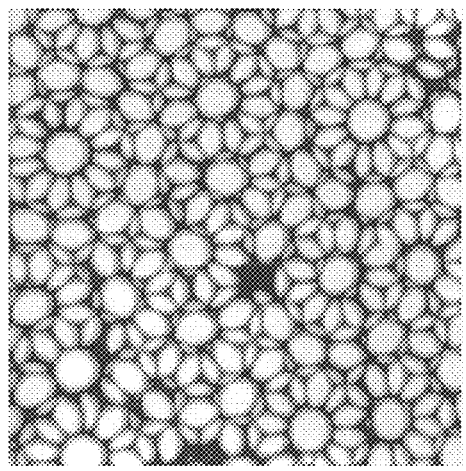
FIG. 30A is an AFM image of the surface of a substrate in Example 3.
Figure 30B:
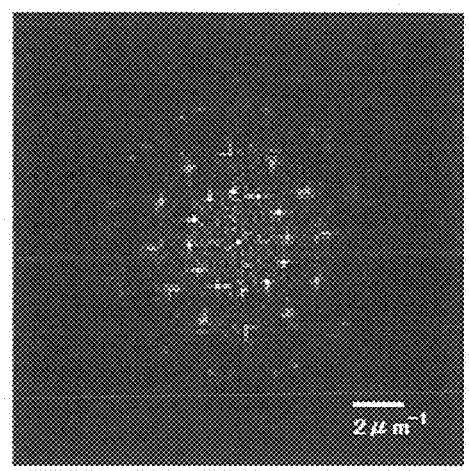
FIG. 30B is a two-dimensional Fourier transform image of the AFM image in FIG. 30A.

Another white organic light emitting diode element was produced by producing a microscopic overlap structure in the same manner as in Example 1 except for the following differences. The spherical colloidal silica and the etching conditions to be used in the second etching step were changed to the spherical colloidal silica and the etching conditions that were used in the first etching step of Example 1. FIG. 30A is an AFM image of the surface of the substrate and FIG. 30B is a two-dimensional Fourier transform image of the AFM image in FIG. 30A, in Example 3. The pitch X and the pitch Y obtained from the two-dimensional Fourier transform image and the height in the AFM image are shown in Table 1.

Comparative Example 1

Figure 31A:
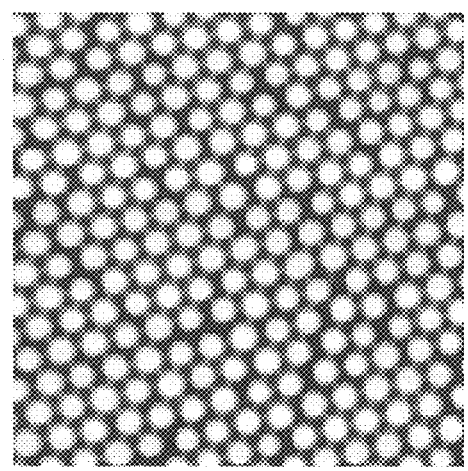
FIG. 31A is an AFM image of the surface of a substrate in Comparative Example 1.
Figure 31B:
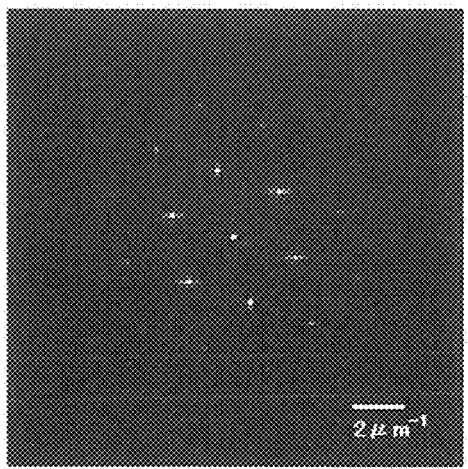
FIG. 31B is a two-dimensional Fourier transform image of the AFM image in FIG. 31A.

The same operation as that of Example 1 was performed except that the second etching step was not performed. Thus, a quartz substrate including a recessing and protruding structure was produced and another white organic light emitting diode element was produced. FIG. 31A is an AFM image of the surface of a substrate and FIG. 31B is a two-dimensional Fourier transform image of the AFM image in FIG. 31A, in Comparative Example 1. The pitch X and the pitch Y obtained from the two-dimensional Fourier transform image and the height in the AFM image are shown in Table 1.

Comparative Example 2

Figure 32A:
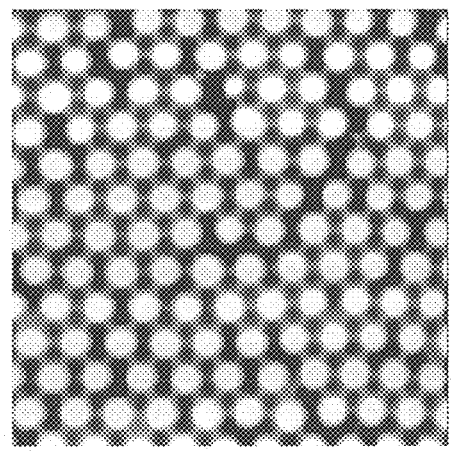
FIG. 32A is an AFM image of the surface of a substrate in Comparative Example 2.
Figure 32B:
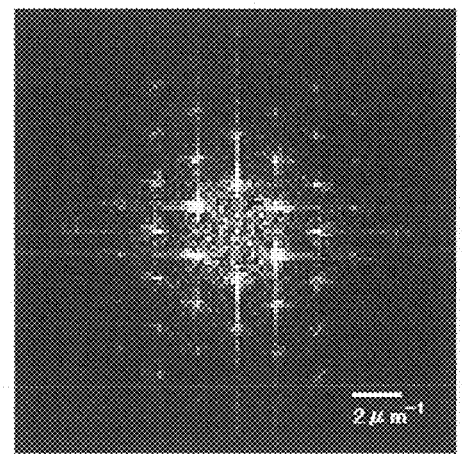
FIG. 32B is a two-dimensional Fourier transform image of the AFM image in FIG. 32A.

The same operation as that of Example 1 was performed except that the first etching step was not performed. Thus, a quartz substrate including a recessing and protruding structure was produced and another white organic light emitting diode element was produced. FIG. 32A is an AFM image of the surface of a substrate and FIG. 32B is a two-dimensional Fourier transform image of the AFM image in FIG. 32A, in Comparative Example 2. The pitch X and the pitch Y obtained from the two-dimensional Fourier transform image and the height in the AFM image are shown in Table 1.

Comparative Example 3

An unprocessed quartz substrate (the same one as the substrate provided in paragraph 0178) was prepared, and the same operation as that of Example 1 was performed except that neither the first etching step nor the second etching step was performed. Thus, a white organic light emitting diode element was produced.

Evaluation of Current Efficiency Characteristics

For each of the white organic light emitting diodes obtained in Examples 1 to 3 and Comparative Examples 1 to 3, the current efficiency characteristics were evaluated by the procedure described below.

As shown in Table 1, the luminance (cd/m$^2$) of the white organic light-emitting diode in a perpendicular direction, when light was emitted therefrom at a current density of 12.5 A/m$^2$, was measured by using a luminance meter, and the current efficiency relative to the current density (relationship between current density (mA/m$^2$) and current efficiency (cd/A)) was determined. Based on these measurement results regarding the current efficiency relative to the current density, the luminance improvement ratio was determined by the following equation. The luminance improvement ratio is a ratio of the measured value of each of Examples 1 to 3 and Comparative Examples 1 to 2 to the measured value of Comparative Example 3.

Relative to blank output (times)=(emission output of organic light emitting element produced in each of Examples 1 to 3 and Comparative Examples 1 and 2)/emission output of organic light emitting element produced in Comparative Example 3)

TABLE 1

| | Particle size measured with particle size distribution meter | | Pitch extracted from FFT | | Distance from origin in two-dimensional FFT image | | AFM modal | | Current efficiency-current density characteristics | Relative |
|---|---|---|---|---|---|---|---|---|---|---|
| | Particle size A (nm) | Particle size B (nm) | Pitch X (nm) | Pitch Y (nm) | Pitch X ($nm^{-1}$) | Pitch Y ($nm^{-1}$) | height Ha (nm) | Light extraction | cd/A (@12.5 $mA/cm^2$) | to blank output |
| Example 1 | 361.1 | 468.5 | 366.9 | 477.5 | 2.73 | 2.09 | 132.0 | Two wavelengths | 8.51 | 2.25 |
| Example 2 | 468.5 | 361.1 | 466.2 | 364.3 | 2.15 | 2.74 | 129.1 | Two wavelengths | 7.94 | 2.10 |
| Example 3 | 468.5 | 468.5 | 471.9 | — | 2.12 | — | 133.4 | One wavelength | 9.15 | 2.42 |
| Comparative Example 1 | 361.1 | — | — | 360.8 | — | 2.77 | 61.7 | One wavelength | 5.86 | 1.55 |
| Comparative Example 2 | 468.5 | — | 478.1 | — | 2.09 | — | 64.9 | One wavelength | 6.84 | 1.81 |
| Comparative Example 3 | BL | | — | — | — | — | — | — | 3.78 | 1.00 |

The substrates produced in Examples 1 to 3 each included, on the surface, the recessing and protruding structure having the outline shape formed by the first arc portion and the second arc portion. The center of the first arc portion was different from the center of the second arc portion. The organic light emitting elements, each of which included electrodes and an organic light emitting layer formed over the recessing and protruding structure, were excellent light emitting elements having very high emission output compared with the organic light emitting elements of Comparative Examples 1 to 3. Furthermore, it was observed that organic light emitting elements including electrodes and an organic light emitting layer formed over the substrate produced in Example 1 or 2 extracted two wavelengths corresponding to the pitch X and the pitch Y, which appeared in the two-dimensional Fourier transform images.

REFERENCE SIGNS LIST

SL First particle
SS Second particle
FL, FS Particle monolayer
X, Y Pitch
11 Substrate
11S Processing surface
11S' Protrusion-formed surface
12 First circular protrusions
12A First periodic mask pattern
13 Second circular protrusions
13A Second periodic mask pattern
14 (14X, 14X', 14Y. 14Y') Protrusion
14A First arc portion
14B Second arc portion
14C First extended arc portion
14D Second extended arc portion
15 Recess
30 Organic EL element
35 Recessing and protruding structure
40 Organic thin film solar cell

The invention claimed is:

1. A substrate comprising a recessing and protruding structure on at least a portion of a surface of the substrate, wherein the recessing and protruding structure includes a plurality of protrusions,
each of the protrusions has an outline shape including an arc shape in plan view of the surface,
the outline shape includes a first arc portion and a second arc portion, the first arc portion having a center different from a center of the second arc portion,
the first arc portion projects in a first direction and the second arc portion projects in a second direction, and
the first direction and the second direction are opposite to each other, and
the plurality of protrusions include first protrusions and second protrusions, each of the first protrusions being adjacent to a corresponding one of the second protrusions, and
an extended arc portion is located on an extension of the first arc portion or the second arc portion of each of the first protrusions, and the extended arc portion overlaps the first arc portion or the second arc portion of a corresponding one of the second protrusions.

2. A substrate comprising a recessing and protruding structure on at least a portion of a surface of the substrate, wherein the recessing and protruding structure includes a plurality of protrusions,
each of the protrusions has an outline shape including an arc shape in plan view of the surface,
the outline shape includes a first arc portion and a second arc poriton, the first arc portion having a center different from a center of the second arc portion,
the first arc portion projects in a first direction and the second arc portion projects in a second direction, and
the first direction and the second direction are opposite to each other, and
center points of arcs of a plurality of the first arc portions collectively form a grating arrangement,
center points of arcs of a plurality of the second arc portions collectively form another grating arrangement, and
the grating arrangement and the another grating arrangement are independent of each other.

3. The substrate according to claim 2, wherein the plurality of protrusions include first protrusions and second protrusions, each of the first protrusions being adjacent to a corresponding one of the second protrusions, center points of the first arc portions of the first protrusions and center points of the first arc portions of the second protrusions collectively form a grating arrangement, center points of the second arc portions of the first protrusions and center points of the second arc portions of the second protrusions collectively form another grating arrangement, the grating arrangement and the another grating arrangement have an identical grating structure, and the grating arrangement and the another grating arrangement are different from each other in at least one of a grating axis direction and a grating pitch.

4. The substrate according to claim 2, wherein the plurality of protrusions include first protrusions and second protrusions, each of the first protrusions being adjacent to a corresponding one of the second protrusions, center points of the first arc portions of the first protrusions and center points of the first arc portions of the second protrusions collectively form a grating arrangement, center points of the second arc portions of the first protrusions and center points of the second arc portions of the second protrusions collectively form another grating arrangement, and the grating arrangement and the another grating arrangement are different from each other in a grating structure.

5. The substrate according to claim 2, wherein at least one of the grating arrangements and the another grating arrangements comprises a triangular grating arrangement.

6. The substrate according to claim 5, wherein the triangular grating arrangement has a pitch ranging from 245 nm to 537 nm.

7. The substrate according to claim 2, wherein at least one of the grating arrangements and the another grating arrangements comprises a square grating arrangement.

8. The substrate according to claim 7, wherein the square grating arrangement has a pitch ranging from 212 nm to 465 nm.

9. A substrate comprising a recessing and protruding structure on a surface of the substrate, wherein the recessing and protruding structure includes a plurality of overlapping periodic components each having a different period, a surface topography of the recessing and protruding structure has a height distribution, and a power spectrum of the heigh distribution includes rings, arcs, or a plurality of spots of high intensity, on circumferences of two or more concentric circles of different radii having a center at an origin, the power spectrum being obtained by two-dimensional Fourier transform of the surface topography, and the radius of each of the concentric circles ranges from 1.9 $\mu m^{-1}$ to 4.7 $\mu m^{-1}$.

10. The substrate according to claim 9, wherein the plurality of periodic components include at least two periodic components having periods, a difference between the periods being greater than or equal to 30 nm.

11. An optical element comprising a substrate, the substrate comprising a shape on at least a portion of a surface of the substrate, the shape being receissing and protruding structure of the substrate, wherein the recessing and protruding structure includes a plurality of protrusions, each of the protrusions has an outline shape including an arc shape in plan view of the surface, the outline shape includes a first arc portion and a second arc portion, the first arc portion having a center different from a center of the second arc portion, the first arc portion projects in a first direction and the second arc portion projects in a second direction, and the first direction and the second direction are opposite to each other, and the plurality of protrusions include the first protrusions and second protrusions, each of the first protrusions being adjacent to a corresponding one of the second protrusions, and being adjacent to a corresponding one of the second protrusions, and an extended arc portion is located on an extension of the first arc portion r the second arc portion of each of the first protrusions, and the extended arc portion overlap the first arc portion or the second arc portion of a corresponding one of the second protrusions.

12. A mold comprising a surface, the surface comprising a shape on at least a portion of a face of the surface, the shape being recessing and protruding structure of the substrate, wherein the recessing and protruding structure includes a plurality of protrusions, each of the protrusions has an outline shape including an arc shape in plan view of the surface, the outline shape includes a first arc portion and a second arc portion, the first arc portion having a center different from a center of the second arc portion, the first arc portion projects in a first direction and the second arc projects in a second direction, and the first direction and the second direction are opposite to each other, and the plurality of protrusions include first protrusions and second protrusions, each of the first protrusions being adjacent to a corresponding one of the second protrusions, and an extended arc portion is located on an extension of the first arc portion or the second arc portion of each of the first protrusions, and the extended arc portion overlap the first arc portion or the second arc portion of a corresponding one of the second protrusions.

13. An organic light emitting element comprising a cathode conductive layer, an organic semiconductor layer, and an anode conductive layer, wherein a recessing and protruding structure of the substrate is formed on an interface between the cathode conductive layer and the organic semiconductor layer, wherein the recessing and protruding structure includes a plurality of protrusions, each of the protrusions has an outline shape including an arc shape in plan view of the surface, the outline shape includes a first arc portion and a second arc portion, the first arc portion having a center different from a center of the second arc portion, the first arc portion projects in a first direction and the second arc portion projects in a second direction, and the first direction and the second direction are oppositve to each other, and the plurality of protrusions include first protrusions and second protrusions, each of the first protrusions being adjacent to a corresponding one of the second protrusions, and an extended arc portion is located on an extension of the first arc portion or the second arc portion of each of the first protrusions, and the extended arc portion overlap the first arc portion or the second arc portion of a corresponding one of the second protrusions.

14. An organic thin film solar cell comprising a cathode conductive layer, an organic semiconductor layer, and an anode conductive layer, wherein a recessing and protruding structure of the substrate is formed on an interface between the cathode conductive layer and the organic semiconductor layer, wherein the recessing and protruding structure includes a plurality of protrusions, each of the protrusions has an outline shape including an arc shape in plan view of the surface, the outline shape includes a first arc portion and a second arc portion, the first arc portion having a center different from a center of the second arc portion, the first arc portion projects in a first direction and the second arc portion projects in a second direction, and the first direction and the second direction are opposite to each other, and the plurality of protrusions include first protrusions and second protrusions, each of the first protrusions being adjacent to a corresponding one of the second protrusions, and an extended arc portion is located on an extension of the first arc portion or the second arc portion of each of the first protrusions, and the extended arc portion overlap the first arc portion or the second arc portion of a corresponding one of the second protrusions.

15. A method for manufacturing a substrate, the method comprising forming a recessing and protruding structure including overlapping periods, the periods including a first period of a first periodic recessing and protruding structure and a second period of a second periodic recessing and protruding structure, wherein the first periodic recessing and protruding structure is provided on at least one surface of the substrate and has a first pitch (X), the first pitch (X) being the first period, the second periodic recessing and protruding structure is formed by etching the first periodic recessing and protruding structure through a periodic mask pattern having a second pitch (Y), the second pitch (Y) being the second period, and the first pitch (X) and the second pitch (Y) satisfy one of the following relationships: $0 \le (X-Y) < 1.2 \times Y$ and $0 \le (Y-X) < 1.2 \times X$.

16. A substrate comprising a recessing and protruding structure on at least a portion of a surface of the substrate, wherein the recessing and protruding structure includes a plurality of protrusions, each of the protrusions has an outline shape including an arc shape in plan view of the surface, the outline shape includes a first arc portion and a second arc portion, the first arc portion having a center different from a center of the second arc portion, the first arc portion projects in a first direction, and the second arc portion projects in a second direction, and the first direction and the second direction are opposite to each other, the plurality of protrusions include first protrusions and second protrusions, each of the first protrusions being adjacent to a corresponding one of the second protrusions, center points of the first arc portions of the first protrusions and center points of the first arc portions of the second protrusions collectively form a grating arrangement, center points of the second arc portions of the first protrusions and center points of the second arc portions of the second protrusions collectively form another grating arrangement, the grating arrangement and the another grating arrangement have an identical grating structure, the grating arrangement and the another grating arrangement are different from each other in grating points, and the grating arrangement and the another grating arrangement have an identical grating pitch.

* * * * *

UNITED STATES PATENT AND TRADEMARK OFFICE
CERTIFICATE OF CORRECTION

PATENT NO. : 10,446,773 B2
APPLICATION NO. : 15/778203
DATED : October 15, 2019
INVENTOR(S) : Kei Shinotsuka and Etsuko Kawamukai Page 1 of 1

It is certified that error appears in the above-identified patent and that said Letters Patent is hereby corrected as shown below:

In the Claims

Column 42, Line 50, in Claim 2, delete "poriton," and insert --portion,--.

Column 43, Line 51, in Claim 9, delete "heigh" and insert --height--.

Column 43, Line 66, in Claim 11, after "being" insert --a--.

Column 43, Line 66, in Claim 11, delete "receissing" and insert --recessing--.

Column 44, Line 9, in Claim 11, after "direction," delete "¶".

Column 44, Line 13, in Claim 11, after "include" delete "the".

Column 44, Lines 18-19, in Claim 11, after "and" delete "being adjacent to a corresponding one of the second protrusions, and".

Column 44, Line 21, in Claim 11, delete "r" and insert --or--.

Column 44, Line 27, in Claim 12, after "being" insert --a--.

Column 44, Line 37, in Claim 12, after "arc" insert --portion--.

Column 44, Line 37, in Claim 12, after "direction," delete "¶".

Column 44, Line 64, in Claim 13, after "direction," delete "¶".

Column 44, Line 66, in Claim 13, delete "oppositve" and insert --opposite--.

Column 45, Line 25, in Claim 14, after "direction," delete "¶".

Signed and Sealed this
Second Day of June, 2020

Andrei Iancu
*Director of the United States Patent and Trademark Office*